(12) United States Patent
Kraehmer et al.

(10) Patent No.: US 8,345,222 B2
(45) Date of Patent: Jan. 1, 2013

(54) HIGH TRANSMISSION, HIGH APERTURE CATADIOPTRIC PROJECTION OBJECTIVE AND PROJECTION EXPOSURE APPARATUS

(75) Inventors: Daniel Kraehmer, Essingen (DE); Ralf Mueller, Aalen (DE); Thomas Schicketanz, Aalen (DE); Wilhelm Ulrich, Aalen (DE); Alexander Epple, Aalen (DE)

(73) Assignee: Carl Zeiss SMT GmbH, Oberkochen (DE)

(*) Notice: Subject to any disclaimer, the term of this patent is extended or adjusted under 35 U.S.C. 154(b) by 603 days.

(21) Appl. No.: 12/580,369

(22) Filed: Oct. 16, 2009

(65) Prior Publication Data
US 2010/0097592 A1    Apr. 22, 2010

Related U.S. Application Data

(60) Provisional application No. 61/106,192, filed on Oct. 17, 2008.

(30) Foreign Application Priority Data

Oct. 17, 2008  (EP) ..................................... 08018215

(51) Int. Cl.
    G03B 27/54    (2006.01)
    G03B 27/70    (2006.01)
    G03B 27/68    (2006.01)
    G03B 27/42    (2006.01)
    G03B 27/52    (2006.01)

(52) U.S. Cl. ................ 355/67; 355/52; 355/53; 355/55; 355/66

(58) Field of Classification Search .................. 355/52, 355/53, 55, 60, 65, 66, 67–71; 359/362–365, 359/694, 726, 733
See application file for complete search history.

(56) References Cited

U.S. PATENT DOCUMENTS

| | | | |
|---|---|---|---|
| 5,774,222 A * | 6/1998 | Maeda et al. | 356/394 |
| 5,963,365 A | 10/1999 | Shirai | |
| 6,252,647 B1 | 6/2001 | Shiraishi | |
| 6,388,822 B1 * | 5/2002 | Kitamura et al. | 359/793 |
| 6,514,674 B1 | 2/2003 | Iwasaki | |
| 7,187,503 B2 * | 3/2007 | Rostalski et al. | 359/649 |
| 7,268,948 B2 | 9/2007 | Matsuo et al. | |
| 7,312,463 B2 * | 12/2007 | Omura | 250/492.2 |

(Continued)

FOREIGN PATENT DOCUMENTS

EP     1 480 065     11/2004

(Continued)

OTHER PUBLICATIONS

Extended Search Report for corresponding EP Application No. 11169144.0, dated Sep. 1, 2011.

(Continued)

*Primary Examiner* — Toan Ton
*Assistant Examiner* — Christina Riddle
(74) *Attorney, Agent, or Firm* — Fish & Richardson P.C.

(57) ABSTRACT

The disclosure provides projection objectives which may be used in a microlithographic projection exposure apparatus to expose a radiation-sensitive substrate arranged in the region of an image surface of the projection objective with at least one image of a pattern of a mask arranged in the region of an object surface of the projection objective. The disclosure also provides projection exposure apparatus which include such projection objectives, as well as related components and methods.

22 Claims, 7 Drawing Sheets

U.S. PATENT DOCUMENTS

| | | | |
|---|---|---|---|
| 2003/0090638 A1* | 5/2003 | Koehler et al. | 355/51 |
| 2004/0095567 A1* | 5/2004 | Ohsaki et al. | 355/67 |
| 2005/0100745 A1 | 5/2005 | Lin et al. | |
| 2005/0225737 A1* | 10/2005 | Weissenrieder et al. | 355/53 |
| 2005/0233113 A1 | 10/2005 | Kotani et al. | |
| 2006/0024018 A1 | 2/2006 | Piehl et al. | |
| 2006/0028715 A1* | 2/2006 | Kato et al. | 359/365 |
| 2006/0050261 A1 | 3/2006 | Brotsack | |
| 2006/0055907 A1 | 3/2006 | Kato et al. | |
| 2006/0135848 A1 | 6/2006 | Koch et al. | |
| 2006/0199040 A1 | 9/2006 | Yamada et al. | |
| 2007/0013887 A1* | 1/2007 | Op de Beeck | 355/55 |
| 2007/0030468 A1* | 2/2007 | Shirai | 355/53 |
| 2008/0007822 A1 | 1/2008 | Dodoc | |
| 2008/0094696 A1 | 4/2008 | Omura et al. | |
| 2008/0304033 A1 | 12/2008 | Kneer et al. | |
| 2009/0027768 A1 | 1/2009 | Omura | |
| 2009/0296204 A1 | 12/2009 | Schuster | |

FOREIGN PATENT DOCUMENTS

| | | |
|---|---|---|
| EP | 1 852 745 | 11/2007 |
| WO | WO 2004/019128 | 3/2004 |
| WO | WO 2005/069055 | 7/2005 |
| WO | WO 2005/081067 | 9/2005 |
| WO | WO 2005/100745 | 10/2005 |
| WO | WO 2006/069055 | 6/2006 |
| WO | WO 2007/025643 | 3/2007 |
| WO | WO 2007/086220 | 8/2007 |
| WO | WO 2008/148462 | 12/2008 |

OTHER PUBLICATIONS

W.H. Southwell, "Pyramid-array surface-relief structures producing antireflection index matching on optical surfaces", J. Opt. Soc. Am. A, vol. 8, No. 3, 1991, pp. 549-553.

* cited by examiner

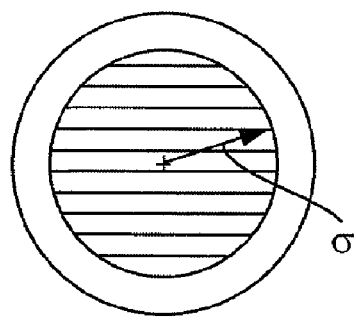
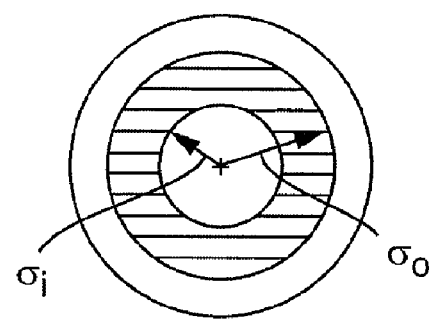
Fig. 2A    Fig. 2B
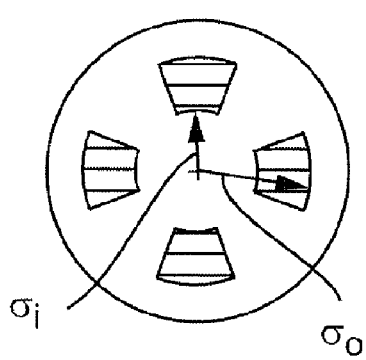
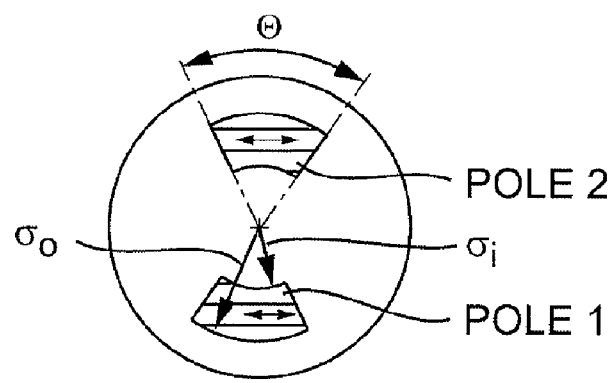
Fig. 2C    Fig. 2D

HIGH TRANSMISSION, HIGH APERTURE CATADIOPTRIC PROJECTION OBJECTIVE AND PROJECTION EXPOSURE APPARATUS

CROSS-REFERENCE TO RELATED APPLICATIONS

This application claims priority under 35 U.S.C. §119(e)(1) to U.S. Provisional Application No. 61/106,192 filed Oct. 17, 2008. This applications also claims priority under 35 U.S.C. §119 to European Patent Application 08018215.7, filed Oct. 17, 2008. The contents of both of these applications are hereby incorporated by reference in its entirety.

FIELD

The disclosure relates to a catadioptric projection objective which may be used in a microlithographic projection exposure apparatus to expose a radiation-sensitive substrate arranged in the region of an image surface of the projection objective with at least one image of a pattern of a mask arranged in the region of an object surface of the projection objective. The disclosure also relates to a projection exposure apparatus which includes such catadioptric projection objective, as well as related components and methods.

BACKGROUND

Microlithographic projection exposure methods and apparatus are used to fabricate semiconductor components and other finely patterned components. A microlithographic exposure process typically involves using a mask (reticle) that carries or forms a pattern of a structure to be imaged, for example a pattern of a layer of a semiconductor component. The pattern is positioned in a projection exposure apparatus between an illumination system and a projection objective in a region of the object surface of the projection objective. Primary radiation from the ultraviolet electromagnetic spectrum (UV radiation) is provided by a primary radiation source and transformed by optical components of the illumination system to produce illumination radiation directed at the pattern of the mask. The radiation modified by the mask and the pattern passes through the projection objective, which forms an image of the pattern in the image surface of the projection objective, where a substrate to be exposed is arranged. The substrate, e.g. a semiconductor wafer, normally carries a radiation-sensitive layer (photoresist).

SUMMARY

In some embodiments, the disclosure to provides a high-aperture catadioptric projection objective having a relatively high overall transmission and, at the same time, a relatively small uniformity error.

A certain fraction of radiation energy available for the lithographic process is lost on the radiation path between the object surface and the image surface of the projection objective. This loss may be quantified by the overall transmission T of the projection objective, which may be quantified, for example, as follows. The transmission for a selected field point, $T_{FP}$, may be defined as $T_{FP}=I_{IS}/I_{OS}$, where $I_{OS}$ is the radiation intensity at an object field point in the object surface and $I_{IS}$ is the intensity of the optically conjugate image field point in the image surface after the radiation originating from the object field point has passed through the projection objective. The overall transmission T of a projection objective for projection with a certain type of effective field may be defined as the minimum value, $T_{MIN}$, of transmission over all field point in the field. Where $T_{MAX}$ is a maximum value of transmission for all field points of an effective field, and $T_{MIN}$ is the minimum value of transmission for a field point in the effective field, a uniformity error U may be defined as a quotient between the difference of the maximum and the minimum value of the transmission over the field and the sum of those values according to $U=(T_{MAX}-T_{MIN})/(T_{MAX}+T_{MIN})$. The uniformity error is one possible measure for the spatial variation of intensity across the illuminated field, wherein the field is the respective area on a substrate which can be illuminated with the projection objective at a given instant of time. If the radiation used for the exposure process is polarized, then the uniformity error may be referred to as "polarized uniformity error $U_P$".

In certain embodiments, the disclosure provides a catadioptric projection objective that includes a plurality of optical elements arranged to image a pattern from an object field in an object surface of the objective to an image field in an image surface region of the objective at an image-side numerical aperture NA with electromagnetic radiation defining an operating wavelength λ. The optical elements include at least one concave mirror having a mirror surface coated with a reflective coating, and a plurality of transparent optical elements, which include one or more optical surfaces provided with a first antireflection structure. The antireflection structure includes a graded index layer having a refractive index gradient with a relatively high refractive index on a substrate side of the graded index layer and a relatively low refractive index close to a refractive index of a gas adjacent to a free surface of the graded index layer. The objective also includes at least one transparent optical element having an optical surface provided with a second antireflection structure structured as a multilayer interference antireflection coating.

With such an arrangement, an advantageous balance between overall transmission and uniformity error may be obtained by suitably combining different types of antireflection coatings. The first antireflection structures including the graded index layer may significantly reduce reflection losses at the surfaces provided with the antireflection structures in a way superior to conventional multilayer interference antireflection coatings, whereby overall transmission is increased relative to conventionally coated systems. Further, only little influence on the state of polarization of transiting radiation is caused by those structures, which is conventionally considered as an additional advantage particularly at surfaces subject to high angles of incidence. However, the inventors have realized that those advantageous properties may cause problems in catadioptric projection objectives including at least one mirror coated with a reflective coating, which typically changes the state of polarization of reflected radiation depending on the structure of the multilayer reflective coating and on other parameters, such as the range of angles of incidence given on a mirror and the location of a reflecting spot on the mirror surface. For example, analysis performed by the inventors revealed that the polarized uniformity error Up may dominate in optical systems where all transparent optical elements are provided with first antireflection structures including a graded index layer, because those layers do not cause substantial uniformity error and therefore can not provide sufficient counterbalancing effect to compensate for the negative influence of the coated mirrors. However, where at least one transparent optical element is provided with an optical surface provided with a multilayer interference antireflection coating, it is possible to compensate substantially the negative influence of the reflective mirrors on uniformity error if the structure of the second antireflection structure is optimized to be effective to compensate at least partly an influence of the reflective coating on uniformity of intensity in an effective image field.

In embodiments where at least 90% of all optical surfaces of the transparent optical elements are provided with the first antireflection structures (including a graded index layer) the overall transmission may be particularly high, since reflection losses and/or absorption caused by multilayer interference antireflection coating may be kept small.

Typical high aperture catadioptric projection objectives for lithography may include a large number of lenses, such as 15 lenses or more, or 20 lenses or more. In some embodiments, the projection objective has 30 or more optical surfaces of transparent optical elements, and only one or only two or only three optical surfaces are provided with a second antireflection structure having a multilayer interference structure. This may keep potential negative influence on overall transmission small.

In a method of designing and manufacturing a projection objective, the projection objective may be analyzed to identify those optical surfaces which have particularly high efficiency in terms of compensating errors caused by coated mirrors. A second antireflection structure including a multilayer antireflection coating may be provided on an optical surface having a contribution to an overall uniformity error which has an opposite effect as a contribution of the reflective coating to the overall uniformity error.

In some cases it has been found useful if the optical surface provided with a second (multilayer) antireflection coating is arranged at a position where a maximum angle of incidence on the object surface is less than 80% of a maximum angle of incidence of all object surfaces of the projection objective. Where the multilayer interference antireflection coating is provided on a surface that is subject only to moderate angles of incidence, the layer structure may be modified with more degrees of freedom to provide the compensating effect desired.

The surface provided with the second compensating multilayer coating may be positioned outside a pupil surface and outside a field surface, i.e. in an intermediate region optically between a pupil surface and a field surface to provide substantial compensating effect varying across the field and, at the same time, sufficient degrees of freedom for layer structure layout. Other positions are possible.

Further degrees of freedom for designing the multilayer interference antireflection coating may be obtained in embodiments where the second antireflection structure includes a graded antireflection coating, i.e. an antireflection coating having a geometrical thickness varying in a predefined manner as function of location on the object surface. Firstly, the geometrical layer thickness of layers may vary as a function of location of the object surface such that, for each location on the object surface, the antireflection coating is effective to reduce reflection in a respective local range of angles of incidence. At the same time, the grading may be optimized such that the graded antireflection coating effectively counteracts the influence of one or more coated mirrors in the system on uniformity and other performance parameters.

In a graded antireflection coating, the layer thickness of individual layers may vary in a rotational symmetric fashion relative to the optical axis of the coated element, which facilitates manufacturing of the coating. The coating thickness at the outer edge of a coated element may be greater than in an inner region close to the optical axis. A continuous increase of layer thickness may be suitable in some cases. In some embodiments, the geometric layer thickness of layers of the graded antireflection coating varies such that a minimum of geometric layer thickness is present in a zone outside an optical axis of the projection objective.

It is also possible to provide a graded antireflection coating without an axis of rotational symmetry. Those coatings may be denoted as "freeform" coatings and provide additional degrees of freedom to tailor the optical performance as a function of location across the coating. A graded antireflection coating may also be rotationally symmetric, but decentered with respect to the optical axis of the projection objective such that the axis of rotational symmetry of the coating is offset relative to the optical axis of the projection objective. Those designs may be favourable particularly in systems operating with an off-axis effective object field and effective image field.

The first antireflection structures including a graded index layer may be manufactured in various ways. For example, a depositing process of coating material may be controlled such that materials with decreasing refractive index are coated subsequently on the substrate to provide a coating structure with a refractive index gradient normal to the coating surface. Alternatively, or in addition, the density of a coating material may be varied, for example by providing a structure with less porosity close to the substrate and increasing porosity towards the free surface of the coating layer. First antireflection structures may also include a graded index layer including periodically distributed nanostructures of a first material, wherein spatial periodicities of the nanostructures are less than the operating wavelength $\lambda$. For high transmittance, the first material should be substantially transparent to radiation at the operating wavelength, which, in many applications in the field of lithography, is in the range between 155 nm and 250 nm The first material may be the material from which the substrate is formed, for example fused silica or calcium fluoride. In these cases, the substrate surface may be structured appropriately by etching of other processes removing substrate material in a spatially varying manner to form nanostructures integral with the substrate.

Based on the teaching of the inventors it is possible to provide catadioptric projection objectives having an image-side numerical aperture NA greater than 1 combined with an overall transmission T equal to or greater than 70% and a polarized uniformity error $U_p$ equal or less than 0.5%. In general, the value of the numerical aperture NA given here is the maximum value for which the projection objective is designed and sufficiently corrected, and which can be utilized in operation of the exposure apparatus. Of course, a projection objective designed for a specific maximum NA may be operated at smaller effective NA by stopping down using a variable aperture stop.

In some embodiments, the projection objective is a catadioptric projection objective designed for imaging an off-axis object field arranged in the object surface into an off-axis image field arranged in the image surface of the projection objective and includes at least one concave mirror. The projection objective may have at least one intermediate image. Catadioptric projection objectives with off-axis fields are frequently used where an imaging free of vignetting and pupil obscuration is desired at high image-side numerical apertures, such as $NA \geqq 0.8$ and where it is desired to avoid utilizing a physical beam splitter having a polarization selective beam splitter surface. Those catadioptric projection objectives may have one or two planar folding mirrors, or may be designed without a folding mirror as an in-line system having one straight optical axis common to all optical elements. Catadioptric projection objectives with off-axis fields, at least one concave mirror and at least one intermediate image are disclosed, for example, in WO 2004/019128, EP 1 480 065 A1 or WO 2005/069055 A2.

The projection objective may be adapted with regard to imaging aberrations to a dry process where the image space between an exit surface of the projection objective and the image surface is filled with a gas having refractive index close to 1 (dry objectives). Those projection objectives may have an image-side numerical aperture $0.8 \leq NA<1$. Some embodiments are adapted to immersion lithography, wherein the projection objective is designed as an immersion objective adapted with regard to imaging aberrations to a wet process where the image space between an exit surface of the projection objective and the image surface is filled with an immersion medium having refractive index significantly larger than 1. Although NA<1 is possible in these cases, the projection objective may have an image-side numerical aperture NA>1.0 when used in connection with an immersion medium having refractive index $n_I>1.3$. For example, NA>1.1 or NA>1.2 or NA>1.3 or NA>1.4 or NA>1.5.

In some embodiments, the optical elements of the projection objective form: a first refractive objective part generating a first intermediate image from radiation coming from the object surface and including a first pupil surface; a second objective part including at least one concave mirror imaging the first intermediate image into a second intermediate image and including a second pupil surface optically conjugated to the first pupil surface; and a third refractive objective part imaging the second intermediate image onto the image surface and including a third pupil surface optically conjugated to the first and second pupil surface.

Embodiments may have, for example, exactly two intermediate images.

The second objective part may have exactly one concave mirror close to or at the second pupil surface and the projection objective may have a first folding mirror for deflecting radiation coming from the object surface in the direction of the concave mirror, or for deflecting radiation coming from the concave mirror towards the image surface. A second folding mirror may be provided for deflecting radiation coming from the concave mirror or the first deflecting mirror in the direction of the image surface. The deflecting mirrors may both be planar.

In some embodiments the second objective part has exactly two concave mirrors, each optically remote from a pupil surface. An embodiment may be designed without folding mirrors and may have one straight optical axis common to all optical elements (in-line system).

Object surface and image surface may be planar and parallel to each other.

In certain embodiments, the disclosure provides a projection objective that includes a plurality of optical elements arranged to image a pattern from an object field in an object surface of the objective to an image field in an image surface region of the objective at an image-side numerical aperture $NA \geq 0.8$ through a medium with refractive index $n_I$ in an image space adjacent to the image surface with electromagnetic radiation defining an operating wavelength $\lambda$, forming a radiation beam. The radiation beam includes a plurality of rays incident on the optical surfaces with a plurality of respective angles of incidence, AOI, defining for each optical surface a maximum angle of incidence, $AOI_{MAX}$, being the maximum angle of incidence present on any one of the optical surfaces with the exception of an exit surface adjacent to the image surface. The condition $NA/n_I>k \sin (AOI_{MAX})$ holds for $k \geq 1$.

With such an arrangement, the design of the projection objective with regard to number and type of optical elements and the shapes and positions of optical surfaces is optimized such that none of the lens surfaces (with the exception of the last lens surface (exit surface) of the projection objective bounding at the image space) is subject only to radiation with rays which do not exceed a critical maximum angle of incidence. Under these conditions antireflection coatings with relatively simple structure (e.g., thin, only few layers) and corresponding relatively small angular band width may be used on most or all optical surfaces. Antireflection coatings having three or less individual dielectric layers may be used, which may provide both a relatively strong antireflective effect (good for increasing overall transmission) and relatively small negative influence on uniformity error.

Empirically the maximum angle of incidence occurring in projection objectives correlates with the image-side numerical aperture NA and the refractive index $n_I$ of the medium in the image space adjacent to the image surface according to the condition $NA/n_I=k \sin (AOI_{MAX})$, where the factor k is typically less than 1 in conventional systems. For example, in high NA dry objectives (adapted to dry lithography where a thin layer of air or another gas with $n_I=1$ is formed between the exit surface of the projection objective and the image surface) with $NA \geq 0.8$ it has been observed that maximum angles of incidence greater than 50° or even greater than 55° or even greater than 60° may occur at one or more optical surfaces. In immersion lithography the image space is typically filled with an immersion liquid having refractive index much greater than 1, such as $n_I=1.3$ or more. Empirically one may find in conventional systems that a critical limit for the maximum angle of incidence of about 50° is typically reached at about NA=1.2. Where image-side numerical apertures significantly higher than those values are desired, the large maximum angles of incidence occurring on some optical surfaces would require more complicated antireflection coatings, which may normally be used only if some degree of overall transmission and/or uniformity performance is sacrificed. A design specifically aimed at reducing the maximum angle of incidence below a critical threshold value, such as 60° or 55° or 50°, may allow to use less complicated antireflection coatings, thereby allowing both a relatively high overall transmission and small contributions to uniformity error.

In some embodiments the condition $NA/n_I=k \sin (AOI_{MAX})$ holds for $k \geq 1.05$, or for k>1.1 or even for k>1.15 or k>1.2.

The condition may be fulfilled particularly for NA values accessible only in immersion lithography, i.e. $NA \geq 1$, for example at NA=1.1 or greater, or at NA=1.2 or greater or at NA=1.3 or greater.

The projection objective may be a catadioptric projection objective, typically including at least one concave mirror in addition to plural lens elements.

In some embodiments, relatively large numbers of suitably shaped aspheric surfaces may contribute to reducing the maximum angle of incidence. Specifically, higher order aspheric surfaces may be useful.

In certain embodiments, the disclosure provides a projection objective that includes a plurality of optical elements arranged to image a pattern from an object field in an object surface of the objective to an image field in an image surface region of the objective at an image-side numerical aperture NA with electromagnetic radiation defining an operating wavelength $\lambda$, forming a radiation beam. The radiation beam includes a plurality of rays incident on the optical surfaces with a plurality of respective angles of incidence, AOI, defining, for each optical surface, a maximum angle of incidence, $AOI_{MAX}$, being the maximum angle of incidence present on the respective optical surface with the exception of an exit surface adjacent to the image surface. NA>1 and wherein $AOI_{MAX}<60°$.

A catadioptric design may be useful in this case.

In some embodiments, the disclosure provides a catadioptric projection objective that includes a plurality of optical elements arranged to image a pattern from an object field in an object surface of the objective to an image field in an image surface region of the objective at an image-side numerical aperture NA with electromagnetic radiation defining an operating wavelength λ. The optical elements include at least one concave mirror and a plurality of transparent optical elements. The projection objective has an image-side numerical aperture $NA \geq 1$, an overall transmission $T \geq 70\%$ and a polarized uniformity error $U_P \leq 0.5\%$.

The previous and other properties can be seen not only in the claims but also in the description and the drawings, wherein individual characteristics may be used either alone or in sub-combinations as embodiments of the disclosure and in other areas and may individually represent embodiments.

BRIEF DESCRIPTION OF THE DRAWINGS

FIG. 2 shows schematically various illumination settings;

DETAILED DESCRIPTION

In the following description of embodiments, the term "optical axis" refers to a straight line or a sequence of a straight-line segments passing through the centers of curvature of optical elements. The optical axis can be folded by folding mirrors (deflecting mirrors) such that angles are included between subsequent straight-line segments of the optical axis. In the examples presented below, the object is a mask (reticle) bearing the pattern of a layer of an integrated circuit or some other pattern, for example, a grating pattern. The image of the object is projected onto a wafer serving as a substrate that is coated with a layer of photoresist, although other types of substrates, such as components of liquid-crystal displays or substrates for optical gratings, are also feasible.

Where tables are provided to disclose the specification of an optical system shown in a figure, the table or tables are designated by the same numbers as the respective figures. Corresponding features in the figures are designated with like or identical reference identifications to facilitate understanding. Where lenses are designated, an identification L3-2 denotes the second lens in the third objective part (when viewed in the radiation propagation direction).

Figure 1:
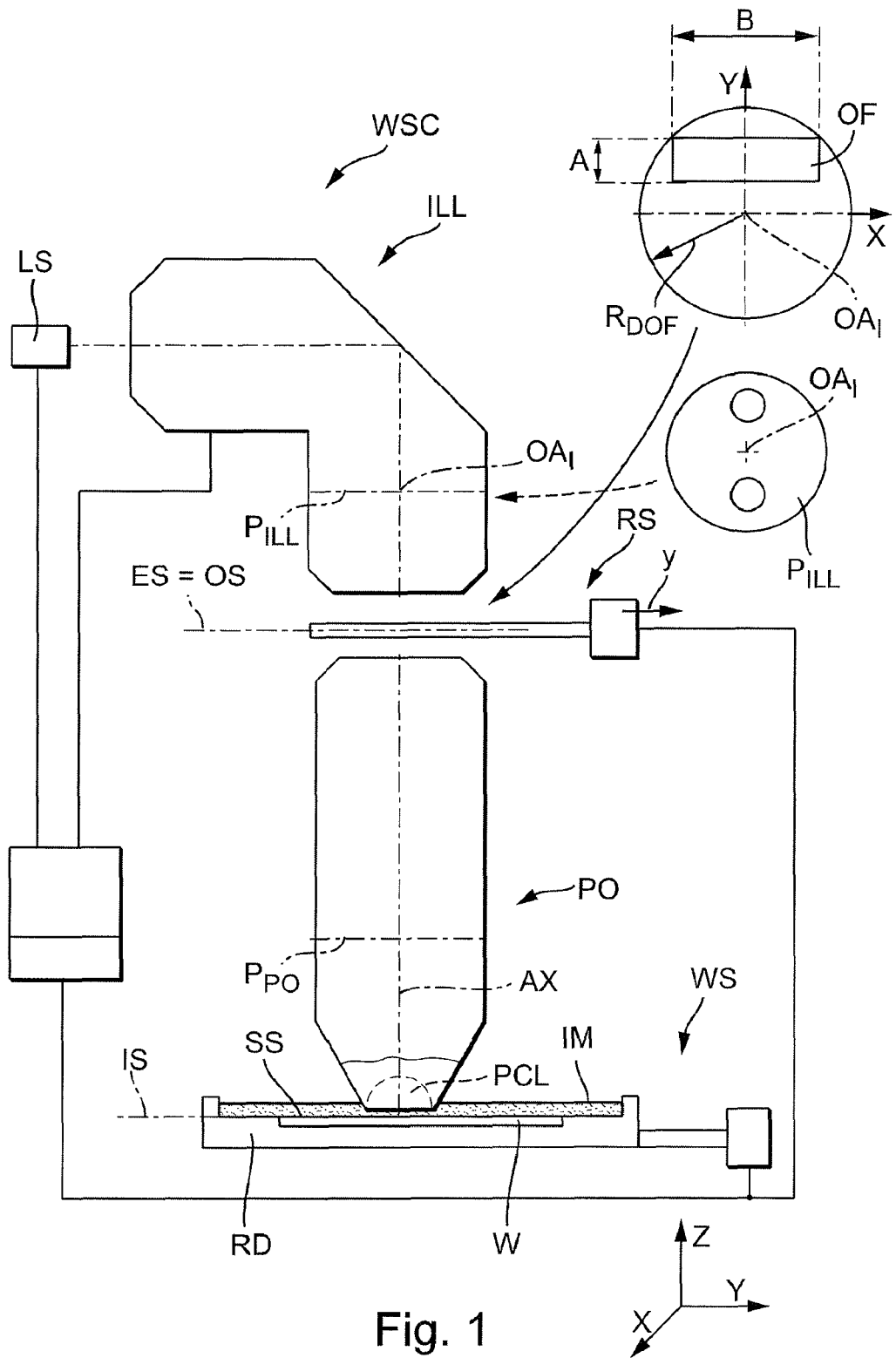
FIG. 1 shows a schematic drawing of a projection exposure apparatus for microlithography having an illumination system and a projection objective.

FIG. 1 shows schematically a microlithographic projection exposure system in the form of a wafer scanner WSC, which is provided for fabricating large scale integrated semiconductor components by means of immersion lithography in a step-and-scan mode. The projection exposure system includes an Excimer laser as light source LS having an operating wavelength of 193 nm. Other operating wavelengths, for example 157 nm or 248 nm, are possible. A downstream illumination system ILL generates, in its exit surface ES, a large, sharply delimited, homogeneously illuminated illumination field arranged off-axis with respect to the optical axis of the projection objective PO (which is coaxial with optical axis $OA_I$ of the illumination system in embodiments) and adapted to the telecentric requirements of the downstream catadioptric projection objective PO. Specifically, the exit pupil of the illumination system coincides with the entrance pupil of the projection objective for all field points. The illumination system ILL has devices for selecting the illumination mode and, in the example, can be changed over between conventional on-axis illumination with a variable degree of coherence, and off-axis illumination, particularly annular illumination (having a ring shaped illuminated area in a pupil surface of the illumination system) and dipole or quadrupole illumination.

A device RS for holding and manipulating a mask M is arranged between the exit-side last optical element of the illumination system and the entrance of the projection objective such that a pattern—arranged on or provided by the mask—of a specific layer of the semiconductor component to be produced lies in the planar object surface OS (object plane) of the projection objective, the object plane coinciding with the exit plane EX of the illumination system. The device RS—usually referred to as "reticle stage"—for holding and manipulating the mask contains a scanner drive enabling the mask to be moved parallel to the object surface OS of the projection objective or perpendicular to the optical axis (z direction) of projection objective and illumination system in a scanning direction (y-direction) for scanning operation.

The size and shape of the illumination field provided by the illumination system determines the size and shape of the effective object field OF of the projection objective actually used for projecting an image of a pattern on a mask in the image surface of the projection objective. The slit-shaped effective object field has a height A parallel to the scanning direction and a width B>A perpendicular to the scanning direction and may be rectangular (as shown in the inset figure) or arcuate (ring field). An aspect ratio B/A may be in a range from B/A=2 to B/A=10, for example. The same applies for the illumination field. A circle with minimum radius $R_{DOF}$ around the effective object field and centred about the optical axis OA of the projection objective indicates the design object field including field points sufficiently corrected for aberrations to allow imaging with a specified performance and free of vignetting. The effective object field includes a subset of those field points.

The reduction projection objective PO is telecentric at the object and image side and designed to image an image of a pattern provided by the mask with a reduced scale of 4:1 onto a wafer W coated with a photoresist layer. Other reduction scales, e.g. 5:1 or 8:1 are possible. The wafer W serving as a light-sensitive substrate is arranged in such a way that the planar substrate surface SS with the photoresist layer essentially coincides with the planar image surface IS of the projection objective. The wafer is held by a device WS (wafer stage) including a scanner drive in order to move the wafer synchronously with the mask M in parallel with the latter, and with reduced speed corresponding to the reduction ratio of the projection objective. The device WS also includes manipulators in order to move the wafer both in the Z direction parallel to the optical axis OA and in the X and Y directions perpendicular to the axis. A tilting device having at least one tilting axis running perpendicular to the optical axis is integrated.

The image of the pattern is formed in an effective image field which has the same shape and aspect ratio as the effective object field OF, but is reduced in size according to the magnification β. The radiation properties within the effective image field determine the quality of the image and thereby influence the properties of the structure formed on the substrate.

The device WS provided for holding the wafer W (wafer stage) is constructed for use in immersion lithography. It includes a receptacle device RD, which can be moved by a scanner drive and the bottom of which has a flat recess for receiving the wafer W. A peripheral edge forms a flat, upwardly open, liquid-tight receptacle for a liquid immersion medium IM, which can be introduced into the receptacle and discharged from the latter by means of devices that are not shown. The height of the edge is dimensioned in such a way that the immersion medium that has been filled in can completely cover the surface SS of the wafer W and the exit-side end region of the projection objective PO can dip into the immersion liquid given a correctly set operating distance between objective exit and wafer surface.

The projection objective PO has an immersion lens group formed by a planoconvex lens PCL, which is the last optical element nearest to the image surface IS. The planar exit surface of the lens is the last optical surface of the projection objective PO. During operation of the projection exposure system, the exit surface of the plano-convex lens PCL is partly or completely immersed in the immersion liquid IM and is wetted by the latter. The convex entry surface of plano-convex lens PCL is adjacent to a gas filling the space between this lens and a lens immediately upstream thereof on the object-side. The plano-convex lens forms a monolithic immersion lens group allowing the projection objective to operate at NA>1 in an immersion operation.

In this application, the term "immersion lens group" is used for a single lens or a lens group including at least two cooperating optical elements providing a convex object-side entry surface bounding at a gas or vacuum and an image-side exit surface in contact with an immersion liquid in operation. The exit surface may be essentially planar. The immersion lens group guides the rays of the radiation beam from gas (or vacuum) into the immersion liquid.

Various different illumination settings may be set with the illumination system ILL. Illumination settings may be characterized by considering the intensity distribution of an effective radiation source (effective source) in a pupil surface $P_{ILL}$ of the illumination system. The pupil surface $P_{PO}$ of the projection objective is optically conjugated to the pupil surface $P_{ILL}$ of the illumination system. Therefore, in the absence of a mask, a spatial intensity distribution equivalent to the intensity distribution at the effective source may be formed in the pupil surface of the projection objective. Where a mask bearing a pattern is inserted between the illumination system and the projection objective, the intensity distribution in the pupil plane of the projection objective also contains diffraction information corresponding to the properties of the mask pattern. FIG. 2 shows representative examples of illumination settings.

FIG. 2A illustrates a simple on-axis illumination mode characterized by the parameter σ shown by an arrow in the figure. Values of σ (often referred to as coherence factor) are conventionally quoted as the ratio of the radius of the illumination intensity disc (hatched) to the radius of the pupil and therefore take a value between 0 and 1.

FIG. 2B shows an annular illumination mode in which the intensity distribution of the source is confined to an annulus to limit the range of angles of incidence of the off-axis illumination, considering that the spatial intensity distribution at the pupil plane is related to the angular distribution at the mask plane, which is a Fourier transform plane to the pupil plane. The annulus may be characterized by the values $\sigma_i$ and $\sigma_o$, which are the ratios of its inner and outer radii to the radius of the pupil.

FIG. 2C illustrates the intensity distribution of the quadrupole illumination mode, the use of which sometimes gives improved imaging results to the use of annular or coherent modes. Conventionally, in using such a quadrupole configuration, it is assumed that the patterned structure of the mask to be projected includes sub-patterns of orthogonal lines along x and y axes and the illumination is oriented such that each of the four poles is situated in a respective one of the four quadrants defined by these x and y axes and at their point of intersection.

In specific applications it has been found that superior performance can be obtained using dipolar illumination modes. For example, where the pattern of the mask to be projected on the wafer essentially consists of parallel lines running in one direction, a dipole setting may be utilized to increase resolution and depth of focus. With dipole illumination, the effective light source is confined to two poles, in order to create the conditions for two-beam imaging with theoretical ideal contrast. FIG. 2D shows an example of the dipolar illumination intensity distribution for a dipole mode. The two poles POLE1, POLE2 of this mode are located off the optical axis OA of the imaging system. For illustrative purposes, the two poles illustrated in FIG. 2D are the to lie along the y axis (parallel to the scanning direction) and will be optimal for imaging lines extending parallel to the x axis (cross scan direction). Sometimes the x and y axis are referred to as horizontal and vertical, respectively, but these terms typically do not bear any relation to the orientation of the machine As illustrated in FIG. 2D the pole shape of the poles POLE1, POLE2 corresponds to an azimuthal (circumferential) section of an annulus. Due to the requirement that the first diffraction order should pass completely through the aperture of the projection objective to obtain maximum contrast, limitations result for the radial width $\Delta\sigma=\sigma_o-\sigma_i$ of the poles and for the azimuthal width (width in circumferential direction) of the poles defined by the pole angle Θ.

Further, the polarization state of radiation incident on the substrate may be controlled to improve image formation. For example, constructive two-beam interference in a dipole mode may be improved if the incident radiation is s-polarized with respect to the respective plane of incidence. This form of polarization is also denoted as tangential polarization and is schematically indicated by the polarization double arrows in FIG. 2D which indicate the respective directions of polarization of the radiation corresponding to the poles. For the purpose of this application, this specific illumination mode will be denoted as "x-polarized Y-dipole" since the poles POLE1, POLE2 lie in the y direction and the direction of predominant polarization is parallel to the x direction.

Illumination systems capable of optionally providing the described off-axis polar illumination modes are described, for example, in U.S. Pat. No. 6,252,647 B1 or in applicant's patent application US 2006/0050261 A1, the disclosure of which is incorporated herein by reference.

Figure 3:
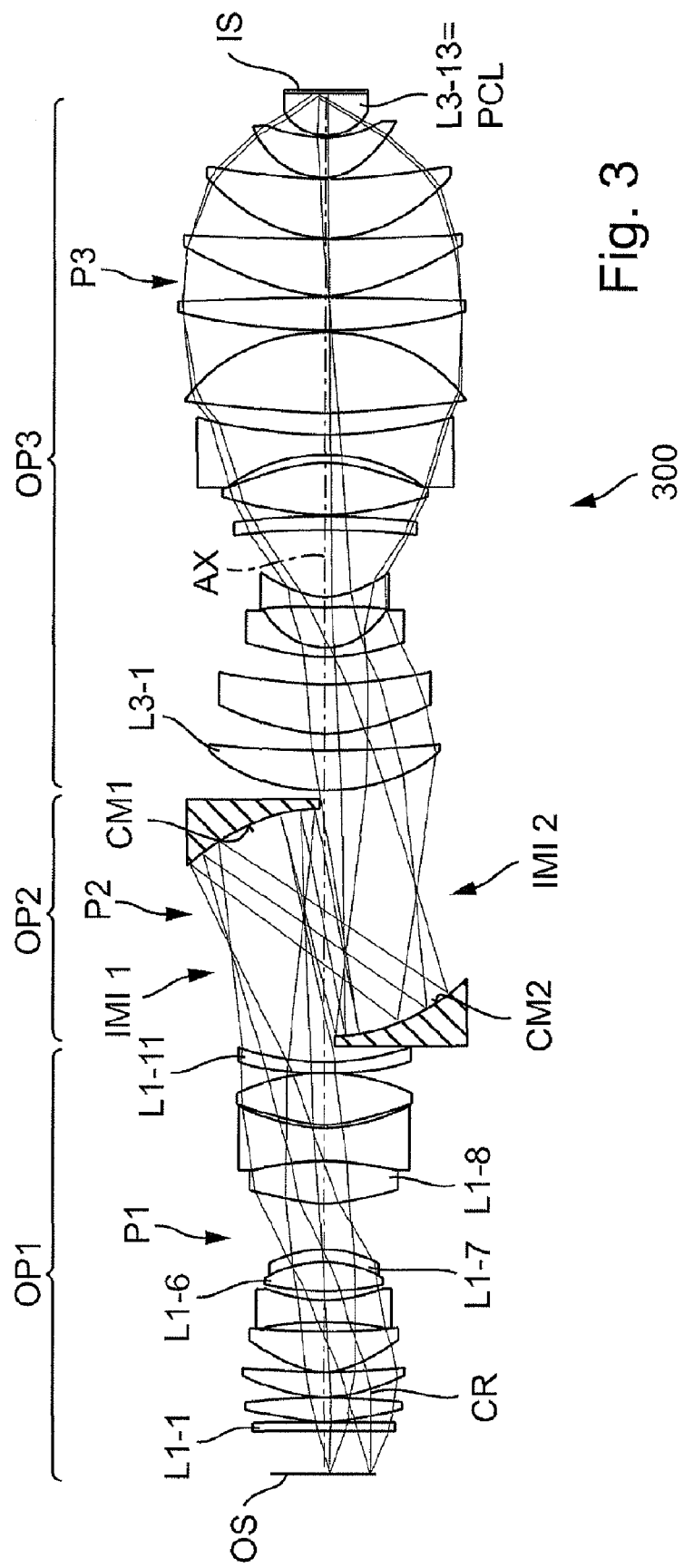
FIG. 3 shows a meridional section of a catadioptric projection objective having high overall transmission and low polarized uniformity error.

FIG. 3 shows a projection objective 300 designed for ca. 193 nm UV operating wavelength. It is designed to project an image of a pattern on a reticle (mask) arranged in the planar object surface OS (object plane) into the planar image surface IS (image plane) on a reduced scale of 4:1 (absolute magnification $|\beta|=0.25$) while creating exactly two real intermediate images IMI1, IMI2. A first refractive objective part OP1 is designed for imaging the pattern in the object surface into the first intermediate image IMI1 at an enlarged scale. A second, catoptric (purely reflective) objective part OP2 images the first intermediate image IMI1 into the second intermediate image IMI2 at a magnification close to 1:1. A third, refractive objective part OP3 images the second intermediate image IMI2 onto the image surface IS with a strong reduction ratio. The second objective part OP2 includes a first concave mirror CM1 having the concave mirror surface facing the object side, and a second concave mirror CM2 having the concave mirror surface facing the image side. The mirror surfaces are both continuous or unbroken, i.e. they do not have a hole or bore in the illuminated area used for reflection. The mirror surfaces facing each other define a catadioptric cavity, which is also denoted intermirror space, enclosed by the curved surfaces defined by the concave mirrors. The intermediate images IMI1, IMI2 (at least the paraxial intermediate images) are both situated inside the catadioptric cavity well apart from the mirror surfaces.

Each mirror surface of a concave mirror defines a "curvature surface" or "surface of curvature" which is a mathematical surface extending beyond the edges of the physical mirror surface and containing the mirror surface. The first and second concave mirrors are parts of rotationally symmetric curvature surfaces having a common axis of rotational symmetry.

The path of a projection CR of a chief ray of an outer field point of the off-axis object field OF onto the meridional plane (drawing plane) is indicated in FIG. 3 in order to facilitate following the beam path of the projection beam. For the purpose of this application, the term "chief ray" (also known as principal ray) denotes a ray running from an outermost field point (farthest away from the optical axis) of the effectively used object field OF to the center of the entrance pupil. Using an off axis rectangular object field the chief ray of the objective may originate at the outermost field corner. Thus, only the projection of the chief ray onto the meridional plane may be displayed in the figures but not its real height. Due to the rotational symmetry of the system the chief ray may be chosen from an equivalent field point in the meridional plane. This equivalent chief ray may not contribute to the imaging when an off axis object field with fold mirrors or other surfaces acting as baffles are used. In projection objectives being essentially telecentric on the object side, the chief ray emanates from the object surface parallel or at a very small angle with respect to the optical axis. The imaging process is further characterized by the trajectory of marginal rays. A "marginal ray" as used herein is a ray running from an axial object field point (field point on the optical axis) to the edge of an aperture stop. That marginal ray may not contribute to image formation due to vignetting when an off-axis effective object field with fold mirrors or other surfaces acting as baffles is used. The chief ray and marginal ray are chosen to characterize optical properties of the projection objectives.

The projection objective is essentially telecentric in image space, i.e. the exit pupil is located essentially at infinity. This determines the position of the pupil surfaces in the subsystems being the conjugate planes to the exit pupil at infinity. The object space may be essentially telecentric as well, thus providing an entrance pupil essentially at infinity.

Three mutually conjugated pupil surfaces P1, P2 and P3 are formed at positions where the chief ray intersects the optical axis. A first pupil surface P1 is formed in the first objective part between object surface and first intermediate image, a second pupil surface P2 is formed in the second objective part between first and second intermediate image, and a third pupil surface P3 is formed in the third objective part between second intermediate image and the image surface IS.

The objective 300 is rotational symmetric and has one straight optical axis AX common to all refractive and reflective optical components. There are no folding mirrors. The concave mirrors have small diameters allowing to put them close together and rather close to the intermediate images lying in between. The concave mirrors are both constructed and illuminated as off-axis sections of axial symmetric surfaces. The light beam passes by the edges of the concave mirrors facing the optical axis without vignetting.

The projection objective 300 is designed as an immersion objective for $\lambda=193$ nm having an image side numerical aperture NA=1.3 when used in conjunction with the high index immersion fluid between the exit surface of the objective closest to the image surface IS, and the image surface IS. Calculations of optical properties have been performed for operation with a rectangular effective image field with size 26 mm*5.5 mm offset by 2.57 mm from the optical axis. The layout of the objection projective with regard to number, shape, position of lenses and other optical elements is taken from a prior art projection objective shown in FIG. 4 and discussed as embodiment 1 (table 1) in WO 2007/086220 A2. The respective disclosure of that reference is incorporated herein by reference.

The projection objective 300 has 24 transparent optical elements (23 lenses and a plane plate immediately adjacent to the object surface), and two concave mirrors. Each of the entry and exit surfaces of the transparent optical elements is provided with an antireflection (AR) structure effective to reduce reflection losses and thereby to increase transmittance of the coated surface. The concave mirror surfaces are coated with high reflectance (HR) reflective coatings.

The type and layout of antireflection structures and reflective coatings of this embodiment are optimized to obtain high overall transmission of the projection objective and, at the same time, excellent polarized uniformity of the intensity in the effective image field, i.e. a relatively low polarized uniformity error. To this end, all but one optical surface of the transparent optical elements L1-1 to L1-11 and L3-1 to L3-13 are provided with first antireflection structure AR1 (see FIG. 4) including a graded index layer having a refractive index gradient with a relatively high refractive index on a substrate side thereof and a relatively low refractive index corresponding to the refractive index of air (n=1) on the opposite free surface side of the graded index layer. One single selected lens surface, namely the concave entry surface of lens L1-7 facing the object surface and being positioned relatively close, but at a distance from the first pupil surface P1, is not provided with a graded index layer, but has a second antireflection structure AR2 structured as a multilayer interference antireflection coating. Details of the types of coatings are further discussed in connection with FIG. 4.

Both concave reflecting surfaces of concave mirrors CM1 and CM2 are coated with a dielectric multilayer interference reflective coating with 33 alternating layers of high refractive index material and low refractive index material. In the embodiment, aluminum oxide ($Al_2O_3$, n=1.7 at 193 nm) or lanthanum fluoride ($LaF_3$, n=1.68 at 193 nm) are used as the relatively high refractive index material, while aluminum fluoride ($AlF_3$, n=1.41 at 193 nm) is used for all low refractive index layers. The complete layout of the dielectric refractive coatings is given in Table A, where layer 1 is the first dielectric layer adjacent to the mirror substrate and layer 33 is the outer layer forming the radiation entry side of the mirror. A material may be described with a complex refractive index N=n–i k, wherein n is the real refractive index and k is the absorption index (or the extinction coefficient) at the operating wavelength. In the table, column 1 shows the geometrical thickness of each layer in [nm], column 2 shows the real refractive index n, column 3 shows the absorption coefficient k and column 4 shows the material.

TABLE A

| | Thickness [nm] | index | Absorption coeff. k | Material |
|---|---|---|---|---|
| Layer 1 | 40.92 | 1.7 | 3.20E−03 | Al2O3 |
| Layer 2 | 37.2 | 1.41 | 1.00E−04 | AlF3 |
| Layer 3 | 26.97 | 1.7 | 3.20E−03 | Al2O3 |
| Layer 4 | 37.2 | 1.41 | 1.00E−04 | AlF3 |
| Layer 5 | 26.97 | 1.7 | 3.20E−03 | Al2O3 |
| Layer 6 | 37.2 | 1.41 | 1.00E−04 | AlF3 |
| Layer 7 | 26.04 | 1.7 | 3.20E−03 | Al2O3 |
| Layer 8 | 38.13 | 1.41 | 1.00E−04 | AlF3 |
| Layer 9 | 26.04 | 1.7 | 3.20E−03 | Al2O3 |
| Layer 10 | 38.13 | 1.41 | 1.00E−04 | AlF3 |
| Layer 11 | 26.04 | 1.7 | 3.20E−03 | Al2O3 |
| Layer 12 | 38.13 | 1.41 | 1.00E−04 | AlF3 |
| Layer 13 | 26.04 | 1.7 | 3.20E−03 | Al2O3 |
| Layer 14 | 39.06 | 1.41 | 1.00E−04 | AlF3 |
| Layer 15 | 25.11 | 1.7 | 3.20E−03 | Al2O3 |
| Layer 16 | 39.99 | 1.41 | 1.00E−04 | AlF3 |
| Layer 17 | 25.11 | 1.7 | 3.20E−03 | Al2O3 |
| Layer 18 | 37.2 | 1.41 | 1.00E−04 | AlF3 |
| Layer 19 | 6.51 | 1.68 | 2.10E−04 | LaF3 |
| Layer 20 | 20.46 | 1.7 | 3.20E−03 | Al2O3 |
| Layer 21 | 38.13 | 1.41 | 1.00E−04 | AlF3 |
| Layer 22 | 8.37 | 1.68 | 2.10E−04 | LaF3 |
| Layer 23 | 18.6 | 1.7 | 3.20E−03 | Al2O3 |
| Layer 24 | 38.13 | 1.41 | 1.00E−04 | AlF3 |
| Layer 25 | 9.3 | 1.68 | 2.10E−04 | LaF3 |
| Layer 26 | 16.74 | 1.7 | 3.20E−03 | Al2O3 |
| Layer 27 | 39.06 | 1.41 | 1.00E−04 | AlF3 |
| Layer 28 | 28.83 | 1.68 | 2.10E−04 | LaF3 |
| Layer 29 | 38.13 | 1.41 | 1.00E−04 | AlF3 |
| Layer 30 | 28.83 | 1.68 | 2.10E−04 | LaF3 |
| Layer 31 | 39.99 | 1.41 | 1.00E−04 | AlF3 |
| Layer 32 | 26.04 | 1.68 | 2.10E−04 | LaF3 |
| Layer 33 | 39.06 | 1.41 | 1.00E−04 | AlF3 |

The reflective coatings of each of the concave mirrors are operated over respective ranges of angles of incidence, with a maximum angle of incidence $AOI_{MAXCM1}=25.3°$ for the first concave mirror CM1 and $AOI_{MAXCM2}=30.8°$ for the second concave mirror CM2. The largest angle of incidence in the entire objective is 65.6°.

The high reflectance of the reflective coatings contributes to a high overall transmission of the projection objective. However, the dielectric multilayer reflective coatings operated at high angles of incidence have a negative effect on the polarized uniformity in the effective image field.

Reflection losses on the lens surfaces are greatly reduced due to the fact that all but one lens surfaces are provided with first antireflection structure including a graded index layer. In each of the graded index layers of the first antireflection structures AR1 the effective refractive index of the structure varies according the diagram in FIG. 5, where the local effective refractive index of the structure, $n_C$, is shown as a function of the relative thickness $d_{REL}$, which takes value 0 on the substrate side of the graded index layer and value 1 on the opposite side facing the environment (vacuum or a gas). Each of the transparent substrates is made of fused silica ($SiO_2$) having refractive index $n_{SiO2}\approx1.56$ at 193 nm. The graded index layer provides the same refractive index on the substrate side, and the refractive index decreases continuously from the substrate surface to the free surface up to n=1. As a result of the smooth transition of refractive index and the absence of internal interfaces having a stepwise transition between different values of refractive index, an excellent index matching and minimum reflection losses occur at those antireflection coatings.

The graded index layers of the first reflective structures AR1 include nanostructures of a dielectric first material transparent to the operating wavelength. The nanostructures are distributed in a regular fashion in a two-dimensional array across the coated surface. Spatial periodicities of the nanostructures are less than the operating wavelength (sub-λ-layer), i.e. less than about 193 nm. The nanostructures may have shape having a relatively broad base on the substrate side and diminishing in size towards the free surface. Specifically, the nanostructures NS schematically shown in FIG. 4 have approximately pyramidal shape or approximately conical shape. A structural width WI of the nanostructures may be in the order of 100 nm or less or 80 nm or less. A structural height HI, measured perpendicular to the coating surface, may be in the order of more than 100 nm, for example more than 180 nm or more than 240 nm The nanostructures may be formed essentially by a dielectric material, such as a metal fluoride or a metal oxide. In the embodiment the nanostructures forming the graded index layer are formed integral with the substrate, i.e. are made from the same material (fused silica, $SiO_2$).

International patent application number PCT/EP2008/003987 filed on May 19, 2008 by the applicant discloses a method of manufacturing antireflection structures including graded index layers effective in the deep ultraviolet (DUV) regime, e.g. at λ=193 nm. Methods disclosed therein may be used to form the first antireflection structures having nanostructures with periodicity in the sub-λ range, i.e. periodicities smaller than the operating wavelength. The disclosure of this document is incorporated herein by reference.

Figure 4:
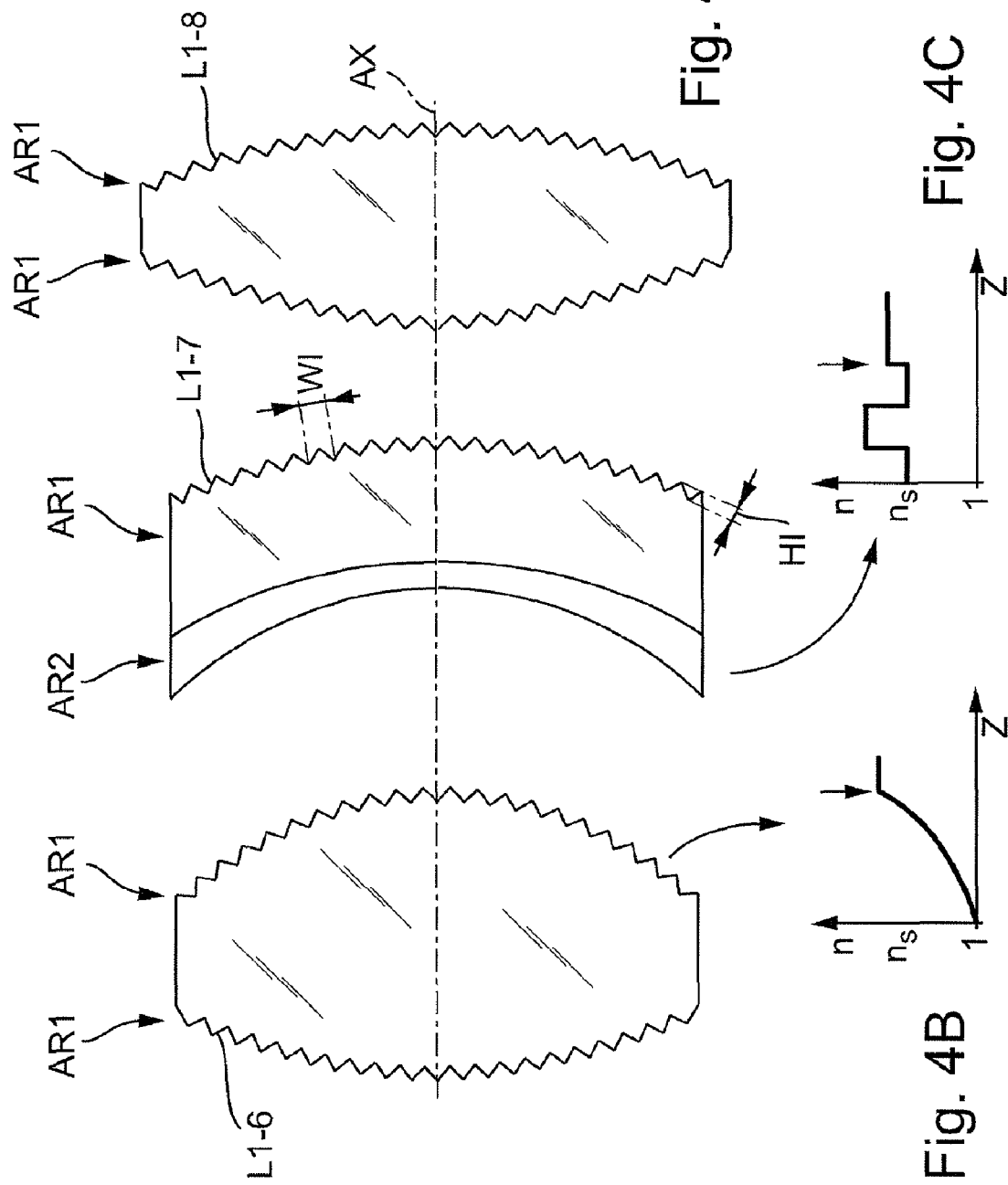
FIG. 4 shows schematically a group of lenses in a projection objective, where lens surfaces are coated with different types of antireflection coatings.
Figure 5:
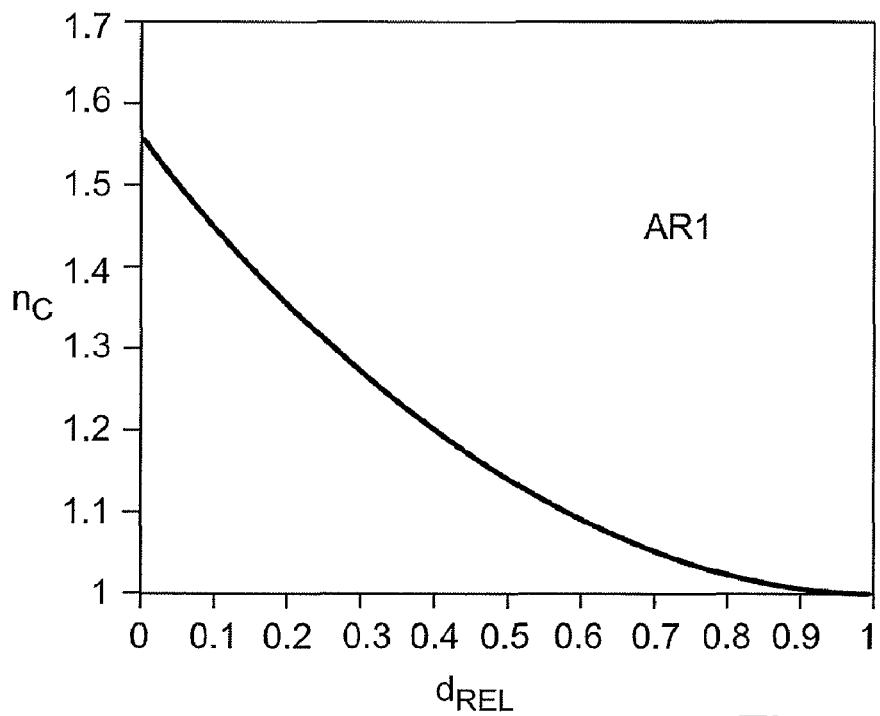
FIG. 5 shows a diagram indicating a continuous grading of refractive index in a graded index layer of a first antireflection coating.

In this type of nanostructures the refractive index is proportional to the density of the material at a certain height, i.e. a certain distance from the solid (undisturbed, not structured) substrate, with high density on the substrate side and diminishing density towards the free surface, whereby a continuous profile of the refractive index generally in accordance with FIG. 5 or FIG. 4B is obtained. In FIGS. 4B and 4C, parameter $n_S$ is the refractive index of the substrate material.

Owing to the superior antireflection properties of graded index layers, a high overall transmission of the projection objective can be obtained if many lens surfaces are coated with such first antireflection coatings. Further, contributions of graded index layers to uniformity errors are low, whereby low overall uniformity error is to be expected when a large number of lens surfaces are provided with graded index antireflection structures.

However, the inventors have found that it may not be advisable to provide all lens surfaces (and surfaces of other transparent optical elements, such as parallel plates) with high efficiency graded index antireflection structure. Specifically, a concave mirror coated with a reflective coating having one or more dielectric layers introduces a certain contribution to uniformity error of the overall system. In conventional systems having a large number of multilayer antireflection coatings effective via interference effects the layout of the interference antireflection coatings can be matched to the contributions of the coated mirrors to compensate the influence of the coated mirrors on the overall uniformity error. Considering that first antireflection structures with graded index layers do not introduce significant contributions to uniformity errors, it is difficult to compensate for the negative influence of the reflective coatings on uniformity error.

The inventors have found that these difficulties can be avoided or minimized if at least one of the antireflection structures is a second antireflection structure AR2 having a dielectric multilayer structure which utilizes interference effects to reduce reflection losses. It has been found that the negative contributions of the high reflective coatings of the mirrors to uniformity may be compensated if a small number of selected optical surfaces of transparent optical elements are coated with appropriately designed multilayer interference antireflection coatings. For example, it may be sufficient to coat only three or only two selected lens surfaces with such second antireflection coatings. In the embodiment of FIG. 3, only one lens surface (concave entry side of lens L1-7) carries a multilayer interference antireflection coating AR2, as schematically shown in FIG. 4, having a stepped refractive index profile as shown schematically in FIG. 4C. This second antireflection structure (formed by a coating) is effective as a compensation coating to compensate at least partly the influence of the reflective coatings of concave mirrors CM1, CM2 on the uniformity of intensity in the effective image field.

In order to identify lens surfaces particularly suitable for carrying such compensation coating, the optical system may be analyzed to identify optical surfaces having a contribution to an overall uniformity error which have an opposite sign as to the contribution of the reflective coatings to the overall uniformity error.

Further, although a multilayer interference coating with uniform layer thickness may be used in some cases, it has been found useful in many cases that a second antireflection coating intended to compensate uniformity errors introduced by coated mirrors be a graded antireflection coating having a geometrical layer thickness of layers varying as a function of location on the optical surface. The variation of layer thickness may be optimized in view of several optimization goals. Specifically, the thickness grading may be designed such that, for each location on the optical surface, the antireflection coating is effective to reduced reflection in a respective local range of angles of incidence. With other words, where the angles of incidence vary locally across the coated surface, a coated surface should be effective in a reflection reducing manner at all locations. In many cases, the absolute angles of incidence and the range of angles of incidence may be relatively low at locations at or close to the optical axis, while those quantities tend to increase towards the outer edge of a lens. Therefore, in general, a geometrical layer thickness of layers in the antireflection coating may be greater at the outer edge of the coated lens than close to the optical axis, particularly in cases where the coating is arranged relatively close to a pupil surface. Secondly, the thickness profile of the coating in radial direction may be optimized to counteract the effect of the coated mirrors on the uniformity error, such that a compensating effect is obtained.

In the embodiment of FIG. 3, the second antireflection structure AR2 on the concave entry side of lens L1-7 is a coating with three dielectric layers, where a first layer adjacent to the substrate and a third layer forming the free surface of the antireflection coating are made of magnesium fluoride ($MgF_2$) (n=1.44 at 193 nm) and the intermediate second layer is made of relatively high refractive lanthanum fluoride ($LaF_3$, n=1.7 at 193 nm) The data of the basic design are given in Table B, where column 1 gives the layer number, column 2 gives a range of geometrical thickness in [nm] and column 3 designates the material.

TABLE B

| Layer | Thickness[nm] | Material |
|---|---|---|
| 1 | 0.05λ–0.15λ | MgF2 |
| 2 | 0.2λ–0.35λ | LaF3 |
| 3 | 0.2λ–0.3λ | MgF2 |

In a graded antireflection coating, the geometrical layer thickness of the single layers varies as a function of location on the optical surface. In the case of a coating rotationally symmetric to the optical axis of the lens, the thickness profile d(h) of the thickness of the layers over the lens height h (radial distance from the optical axis) may be described by the following polynomial expression:

$$d(h)=d_0(a_1+a_2h+a_3h^2+a_4h^3+a_5h^4+a_6h^5+a_7h^6)$$

where $d_0$ designates the nominal thickness of each layer, as given in column 2 of Table B. The coefficients a, for the specific layer of the embodiment are as follows: $a_1$=9,00000000E-01; $a_2$=−2,11583880E-03; $a_3$=3,84262150E-05; $a_4$=1,20995790E-06; $a_5$=1,82050420E-08; $a_6$=5,57E-11; $a_7$=−7,60E-12

Other dielectric multilayer interference antireflection coatings, e.g. such as disclosed in U.S. Pat. No. 5,963,365, may alternatively be used as a basic design for a second antireflection coating compensating the effects of the mirrors on uniformity.

Figure 6:
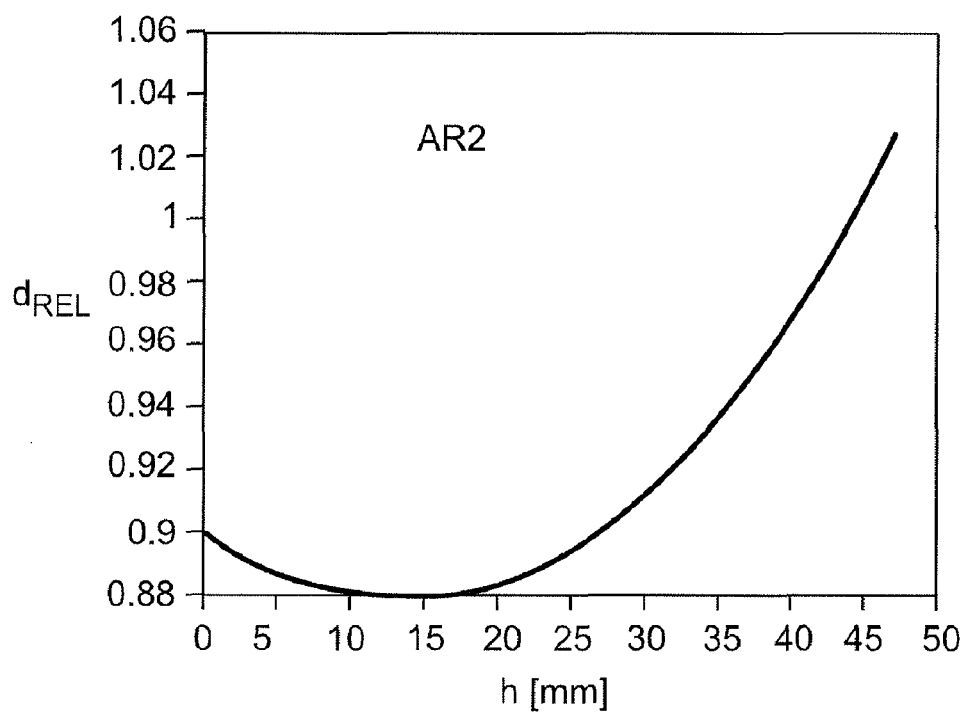
FIG. 6 shows a diagram indicating the dependency of the relative geometrical thickness of a graded multilayer interference antireflection coating from the lens height.

FIG. 6 shows the dependence of the relative thickness $d_{REL}$ on the lens height h. The relative thickness $d_{REL}$ in FIG. 6 is defined such that the relative thickness $d_{REL}$=1 corresponds to the design thickness of the layers given in Table B. It is evident that the layer thicknesses of each of the layers are more than 10% greater at the outer edge of the lens (lens height ≈45 mm) than the respective thicknesses on the optical axis (h=0). Further, the geometrical layer thickness has a minimum of geometrical layer thickness in a zone outside the optical axis of the projection objective at lens height h=15 mm which contributes, for the specific case, to compensation of the negative effects of the reflective coatings on uniformity error.

In order to demonstrate the beneficial effect of the targeted use of interference antireflection layers in combination with graded index antireflection structures on transmission and polarized uniformity, the overall transmission T and the polarized uniformity $U_P$ have been calculated both for the embodiment of FIG. 3 and for a reference system for a specific reference illumination setting typical of operating modes of projection systems operating with polarized radiation in a dipole mode to obtain efficient two-beam interference contrast in the image surface. The reference illumination setting is a x-polarized Y-dipole setting as explained above in connection with FIG. 2D, where $\sigma_i$=0.77, $\sigma_o$=0.97, where the poles are symmetrically outside the x-axis in the y-direction and where the radiation has x-polarization (i.e. oscillation direction of the electromagnetic field essentially parallel to the x-direction).

Under these reference conditions, a value $U_P$=0.28% is obtained for the polarized uniformity error and the total transmission T=71.3%.

The reference system has the same basic design as shown and discussed in connection with FIG. 3, and the same reflective coatings are present on concave mirror CM1 and CM2. However, all lens surfaces and the surfaces of the entry side parallel plate L1-1 are provided with a graded index antireflective structure providing the refractive index gradient shown in FIG. 5.

In the reference system, a value $U_P$=0.67% is obtained for the polarized uniformity error at a total transmission T=71.55.

A comparison shows that the overall transmission of the reference system is only slightly higher than that of the embodiment having a compensating multilayer antireflective coating (T=71.3%). However, the polarized uniformity error is significantly larger and more than twice the corresponding value in the compensated system including the multilayer antireflective coating ($U_P$=0.28%). This proves exemplarily that the polarized uniformity error can be significantly reduced by providing at least one appropriately designed multilayer AR coating without substantially decreasing the overall transmission.

Another approach for obtaining a catadioptric projection objective having both high overall transmission and small polarized uniformity error will now be explained in detail in connection with FIGS. 7 and 8.

The approach will now be explained in detail in connection with catadioptric projection objective 700 shown in FIG. 7. The basic layout of the optical system regarding the number and sequence of objective part OP1, OP2, OP3, the character of the objective parts (refractive or purely reflective), the number and approximate location of intermediate images IMI1, IMI2, and the construction as an inline system having one straight optical axis AX common to all optical elements is the same as for the embodiment in FIG. 3. Therefore, reference is made to the respective description above. The number, position and/or surface shapes of lenses and concave mirrors CM1, CM2 are different.

Projection objective 700 is designed for a nominal UV-operating wavelength $\lambda$=193 nm. An image-side numerical aperture NA=1.55 is obtained at a reducing magnification 4:1 ($\beta$=−0.25) in a rectangular off-axis image field with size 26 mm×5.5 mm offset by 4.58 mm from the optical axis when an immersion liquid with refractive index $n_I$=1.65 is present in the image space. The immersion lens group formed by plano-convex lens PCL is made of ceramic magnesium aluminium oxide (MgAlO$_4$), also denoted as spinel, having a refractive index n≈1.92 at $\lambda$=193 nm. All other lenses are made of fused silica. The radius $R_{DOF}$ of the design object field, also denoted object field height OBH, is 65.8 mm The specification is given in tables 7 and 7A.

As a special feature, the overall design is optimized to avoid very large angles of incidence occurring on lens surfaces, as we explain in detail below.

The radiation beam passing from the object surface OS towards the image surface IS is formed by a plurality of rays incident on or emitted from the optical surfaces with a plurality of respective angles of incidence, AOI. In general, the angle of incidence (AOI) of a ray at a given location of an optical surface is the angle included between the propagation direction of the ray at the location on optical surface, and the surface normal to the optical surface at the location of incidence. In this application the following definition is used: on an entry surface of a lens the angle of incidence is defined between the incident ray and the surface normal, whereas on an exit surface of a lens the angle of incidence is defined between the exiting ray and the surface normal. Therefore, according to this definition, the angle of incidence at a refracting interface between an optically thick medium (e.g. glass or a transparent crystal) and an optically thinner medium (e.g. air or another gas) is measured in the optically thinner medium. As a plurality of non-parallel rays is incident on the optical surface, a maximum angle of incidence, $AOI_{MAX}$, can be determined, which is the maximum angle of incidence occurring for any location on the respective optical surface.

The optical system is optimized such that none of the lens surfaces (with the exception of the last lens surface of the projection objective, i.e. planar exit surface of plano-convex lens PCL) is subject to radiation having incidence angles of more than 50.7°, which is the maximum angle of incidence, $AOI_{MAX}$ of the entire projection objective, and occurs at the aspheric exit side of the penultimate lens L3-9 on the image side.

The technical measures helping to reduce the maximum angle of incidence occurring within the optical system include providing a large number of aspheric surfaces, which may also include aspheres of higher order.

The projection objective may include at least one "double asphere". The term "double asphere" as used here describes the situation where two aspherical lens surfaces are directly following each other along the optical path. The double asphere may be formed by facing surfaces of two separate, neighbouring lenses or on a double aspherical lens (biasphere) where both lens surfaces are aspherical surfaces. The projection objective may include at least one triple asphere (three immediately consecutive aspherical surfaces) or higher order multiple aspheres, where e. g. 4, 5, 6 or more immediately consecutive aspherical surfaces are provided.

Specifically, third objective part OP3 imaging the final intermediate image IMI2 onto the image surface IS includes a seven "double aspheres". For example, pairs of immediately consecutive aspheres on both sides of a space filled with air or another gas are formed between lenses L3-3 and L3-4, between lenses L3-5 and L3-6, between lenses L3-6 and L3-7 and between lenses L3-8 and L3-9. Further, third objective part OP3 includes three double aspheric lenses (biaspheres), namely lenses L3-6, L3-7 and L3-9.

The condition $NA/n_I = k \sin(AOI_{MAX})$ holds for k=1.24, indicating that the maximum angle of incidence is relatively small although the image-side NA is extremely high.

Where an optical system is optimized to avoid very large angles of incidence, it is possible to utilize dielectric multilayer antireflection coatings with a relatively small angular band width. As used here in, the term "angular band width" (or acceptance angle) denotes a range of angles of incidence around a given center angle of incidence for which the residual reflectance provided by the antireflection coating lies below a critical threshold value, e.g. below 1% or below 0.5% residual reflection. While antireflection coatings with more than three layers are typically employed where a larger angular band width is desired, antireflection coatings with a small number of individual layers, such as three layers or less, may be utilized where the required angular bandwidth is smaller. This effect generally observed in multilayer antireflection coatings is illustrated in FIG. 8, which shows the average transmittance $T_{AV}$ [%] of an interface coated with an antireflection coating as a function of the angle of incidence AOI of incident radiation.

Curve T1 corresponds to a 3-layer AR coating, whereas curve T2 corresponds to a 6-layer AR coating.

Where the number of single layers of an antireflection coating is low, the overall volume of coating material may be kept small. Also, the number of interfaces between adjacent materials (substrate and first layer, first layer and optional following layers) may be kept small. Further, if the single layers are made of materials substantially transparent to the incident radiation (i.e. having very low specific absorption for the respective wavelength range) the level of absorption within the multilayer stack can be kept low, thereby increasing transmittance.

Figure 8:
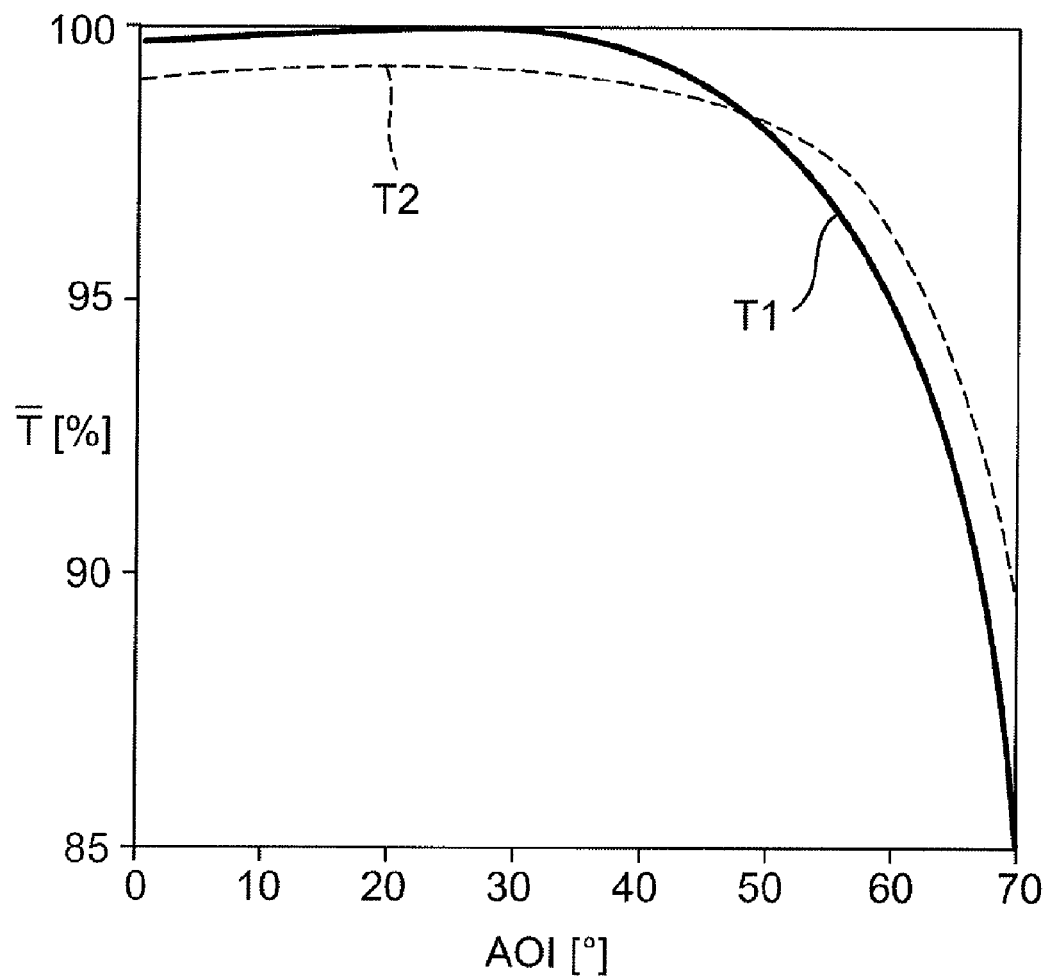
FIG. 8 shows for two different multilayer interference antireflection coatings the dependency of the average transmission from the angle of incidence of incident radiation.

Referring to FIG. 8, a 3-layer antireflection coating having an angle dependent transmittance according to solid transmittance curve T1 may be used up to angles of incidence of about 50° and provides residual reflections of less than about 1% or even less than 0.5% over most part of this angular range. On the other hand, if a reflection reducing effect is also required for larger angles of incidence beyond 50°, an antireflection coating having an angle dependent transmittance according to transmittance curve T2 would be desirable, in particular since the transmittance is higher for AOI>50°. This AR coating has 6 individual layers.

It is evident that antireflection coatings with smaller acceptance range of angles of incidence, but a corresponding higher transmittance would be desirable if a large overall transmission of the projection objective is desired. As a consequence, where the optical design of the projection objective is optimized to avoid large angles of incidence, then the lens surfaces may be coated with low-absorption, high-transmittance multilayer antireflection coatings with small number of single layer, such as three layers or less. As a further consequence, since the difference between the maximum value of transmittance and the minimum value of transmittance in the range of angles of incidence is smaller under conditions where the maximum angel of incidence is limited, e.g. to value of about 50° or less, the contribution of the antireflection coatings to uniformity error is smaller for the low-absorption, high-transmittance antireflection coatings with simple structure (according to transmission curve T1).

Figure 7:
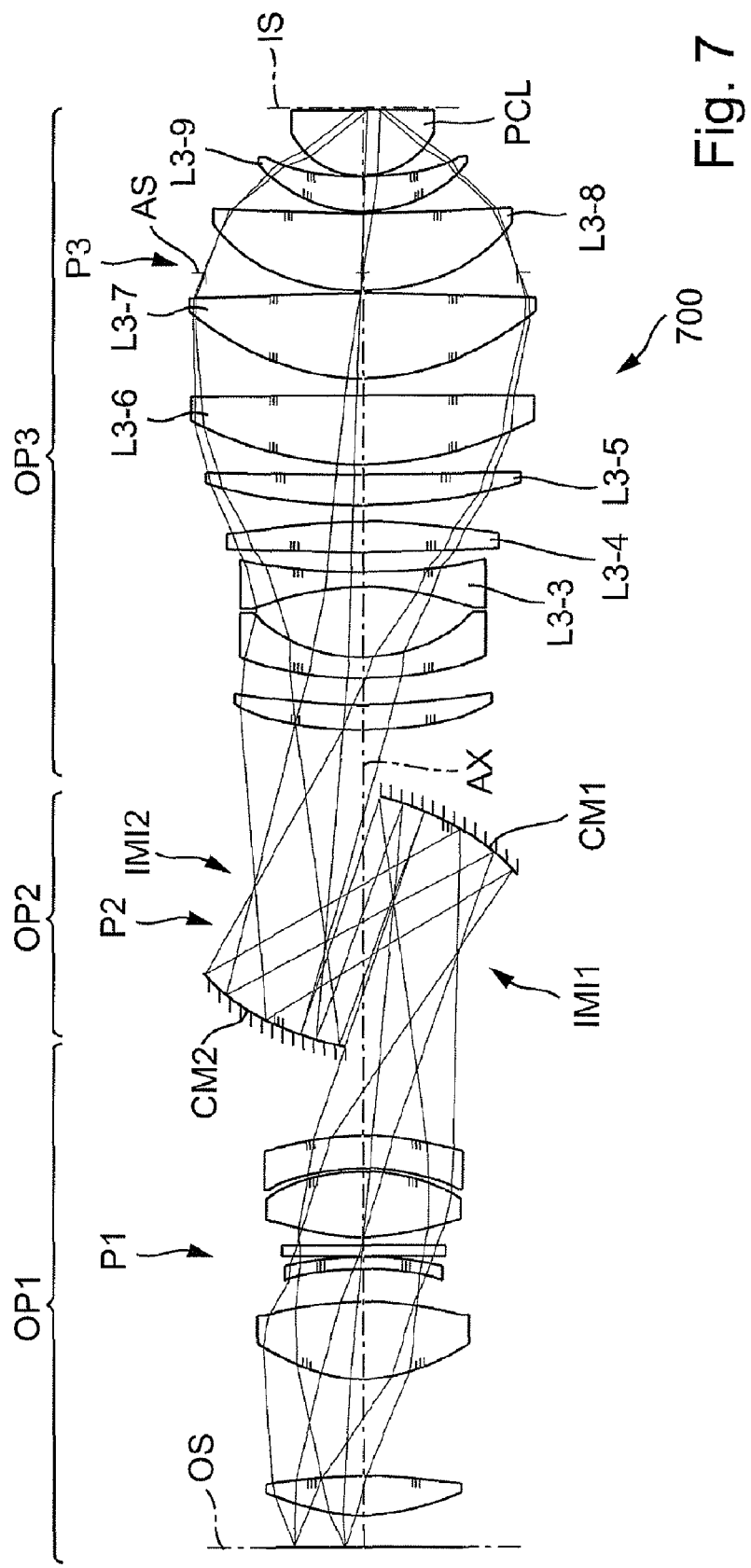
FIG. 7 shows a meridional section through a catadioptric projection objective having high overall transmission and low polarized uniformity error.

In the embodiment of FIG. 7, each of the lens surfaces is coated with a three-layer antireflection interference coating with a basic design according to table B. The parameters a, defining the variation of geometric layer thickness for the graded antireflection coatings are given in table D. It is evident, that the grading function is different for different lens surfaces.

TABLE D

| SUR | a1 | a2 | a3 | a4 |
|---|---|---|---|---|
| 1 | 1.01164230E+00 | 5.31820700E−04 | 5.75566730E−08 | 2.23968360E−08 |
| 2 | 9.99345420E−01 | −1.35414770E−04 | 3.80748900E−07 | −1.56279240E−08 |
| 3 | 1.01429110E+00 | 1.18650320E−04 | −1.88407690E−07 | −8.92336700E−10 |
| 4 | 1.00533880E+00 | 3.27296990E−04 | −1.01822120E−07 | 1.66386860E−08 |
| 5 | 1.00609640E+00 | 3.77588590E−04 | −3.93948060E−07 | 6.28053730E−08 |
| 6 | 1.00725160E+00 | −9.47162590E−05 | −3.20489220E−07 | −8.05290930E−09 |
| 7 | 1.00573460E+00 | −9.37661490E−05 | −2.82637390E−07 | −1.14084940E−08 |
| 8 | 1.00502840E+00 | −1.01067390E−04 | −2.74056640E−07 | −8.54568910E−09 |
| 9 | 9.96079310E−01 | 1.69207340E−04 | −2.34168130E−07 | 2.35977290E−08 |
| 10 | 1.02307350E+00 | 2.78070200E−04 | −3.06055950E−07 | −6.52769500E−09 |
| 11 | 1.02380030E+00 | 1.55721410E−04 | −3.29273920E−07 | −1.56585910E−08 |
| 12 | 1.02075720E+00 | −1.06177360E−04 | −3.20595640E−07 | −2.44310080E−08 |
| 13 | 1.00400000E+00 | 0.00000000E+00 | 0.00000000E+00 | 0.00000000E+00 |
| 14 | 1.00400000E+00 | 0.00000000E+00 | 0.00000000E+00 | 0.00000000E+00 |
| 15 | 1.01101510E+00 | 1.69585680E−04 | −5.01106900E−08 | −2.14975530E−09 |
| 16 | 1.00815840E+00 | −1.03988590E−05 | −8.37627070E−08 | −5.98004500E−09 |
| 17 | 1.00897650E+00 | 3.57318870E−05 | −1.08957140E−07 | −5.56187470E−09 |
| 18 | 1.01445020E+00 | 2.16994610E−04 | −1.57880420E−07 | 1.22073140E−08 |
| 19 | 1.00886190E+00 | 8.77194000E−07 | −1.75654300E−07 | −5.99400070E−09 |
| 20 | 1.01488480E+00 | 1.60291960E−05 | −1.15242250E−07 | −7.93834540E−10 |
| 21 | 1.01326780E+00 | −6.27223940E−05 | −1.05122230E−07 | −5.08055120E−09 |
| 22 | 1.01114520E+00 | −9.98874130E−06 | −1.43033160E−07 | −2.85312910E−09 |
| 23 | 1.01329670E+00 | −7.04901350E−07 | −7.87936470E−08 | −1.28651170E−09 |
| 24 | 1.01115910E+00 | −8.28488660E−07 | −1.08295970E−07 | −1.06556850E−09 |
| 25 | 1.01223840E+00 | −3.74701420E−06 | −6.95166470E−08 | −7.31688420E−10 |
| 26 | 1.01062640E+00 | −2.13552090E−05 | −8.98224390E−08 | −7.43472300E−10 |
| 27 | 1.01137050E+00 | −9.41799270E−06 | −7.31166080E−08 | −5.40111140E−10 |
| 28 | 1.01118670E+00 | −1.12301970E−05 | −7.55219120E−08 | −5.16736500E−10 |
| 29 | 1.01029220E+00 | −2.25451190E−05 | −1.03675140E−07 | −8.18239680E−10 |
| 30 | 1.01491690E+00 | 1.13018860E−05 | −6.10608540E−08 | −1.79988180E−09 |
| 31 | 1.00760940E+00 | −2.06612910E−04 | −2.11133310E−07 | −9.00128890E−09 |
| 32 | 1.01718980E+00 | 2.45544550E−04 | −4.52173130E−08 | −1.39493700E−08 |
| 33 | 9.99109890E−01 | −5.19836950E−04 | 1.10177050E−06 | −6.70947160E−08 |
| 34 | Not coated (Immersion) | | | |

| SUR | a5 | a6 | a7 |
|---|---|---|---|
| 1 | 1.15637060E−10 | 3.51755080E−13 | −2.66854410E−15 |
| 2 | −1.41899320E−10 | −1.32179010E−12 | −1.27989170E−14 |
| 3 | −1.68355370E−11 | −2.67101900E−13 | −3.84527990E−15 |
| 4 | 1.05737530E−10 | 6.09705750E−13 | 2.74700240E−15 |
| 5 | 5.88040590E−10 | 5.40013780E−12 | 4.98550840E−14 |
| 6 | −8.95935340E−11 | −1.13255840E−12 | −1.51612770E−14 |
| 7 | −1.15965220E−10 | −1.14791430E−12 | −1.12288390E−14 |
| 8 | −7.19785980E−11 | −5.56025550E−13 | −3.80800900E−15 |
| 9 | 2.31273550E−10 | 2.28626350E−12 | 2.31838870E−14 |
| 10 | −1.02845330E−10 | −1.30722170E−12 | −1.59996260E−14 |
| 11 | −1.74281390E−10 | −1.87381640E−12 | −2.07063060E−14 |
| 12 | −2.16517620E−10 | −1.95879640E−12 | −1.87069950E−14 |
| 13 | 0.00000000E+00 | 0.00000000E+00 | 0.00000000E+00 |
| 14 | 0.00000000E+00 | 0.00000000E+00 | 0.00000000E+00 |
| 15 | −2.47879740E−11 | −2.17982290E−13 | −1.82588510E−15 |

TABLE D-continued

| | | | |
|---|---|---|---|
| 16 | −4.07516640E−11 | −2.64375480E−13 | −1.71049620E−15 |
| 17 | −4.18977850E−11 | −2.95980160E−13 | −2.10541800E−15 |
| 18 | 7.80390070E−11 | 4.04851620E−13 | 1.12140190E−15 |
| 19 | −5.43029950E−11 | −4.41578230E−13 | −3.45638300E−15 |
| 20 | −8.55481250E−12 | −1.18153440E−13 | −1.59265470E−15 |
| 21 | −3.59511970E−11 | −2.64091020E−13 | −2.06788100E−15 |
| 22 | −2.08783320E−11 | −1.45289040E−13 | −1.00080360E−15 |
| 23 | −9.23103060E−12 | −6.61905670E−14 | −4.80595080E−16 |
| 24 | −6.80288880E−12 | −4.15156190E−14 | −2.51123220E−16 |
| 25 | −4.88931800E−12 | −3.26408310E−14 | −2.18839210E−16 |
| 26 | −3.97198270E−12 | −2.11999920E−14 | −1.13245230E−16 |
| 27 | −3.32722820E−12 | −2.08124890E−14 | −1.31847190E−16 |
| 28 | −3.26940800E−12 | −2.06207810E−14 | 1.30302380E−16 |
| 29 | −5.15960960E−12 | −3.33723850E−14 | 2.21240550E−16 |
| 30 | −1.63399970E−11 | −1.43599440E−13 | −1.25633040E−15 |
| 31 | −6.13175260E−11 | −4.33522680E−13 | −3.10625570E−15 |
| 32 | −1.78867650E−10 | −2.03067960E−12 | −2.28966240E−14 |
| 33 | −7.15473640E−10 | −8.75649270E−12 | −1.26743120E−13 |
| 34 | | | |

The overall transmission T of the projection objective when used with the reference illumination setting discussed above (x-polarized y-dipole) is 77.1%. The polarized uniformity error is 0.28%, which is significantly smaller than the corresponding value for the reference system mentioned above, having graded index nanostructures antireflective structures on all lens surfaces.

The uniformity U and the polarized uniformity Up as defined herein are only two of a larger number of performance parameters which may be used as a measure (or indicator) to characterize the optical performance of an optical system quantitatively with regard to the evenness with which an image is formed in a relatively large effective image field. In general, other parameters, such as ellipticity or energetic telecentricity can also be improved by measures described in this specification and might therefore be used as an indicator to show a good balance between overall transmission T and the respective quantity indicative of the evenness of the image formation in the effective image field.

The above description of the embodiments has been given by way of example. From the disclosure given, those skilled in the art will not only understand the present disclosure and its attendant advantages, but will also find apparent various changes and modifications to the structures and methods disclosed. It is sought, therefore, to cover all changes and modifications as fall within the spirit and scope of the disclosure, as defined by the appended claims, and equivalents thereof.

The content of all the claims is made part of this description by reference.

The following tables summarize specifications of embodiments described above. In the tables, column 1 specifies the number of a refractive surface or a reflective surface or a surface distinguished in some other way, column 2 specifies the radius r (radius of curvature) of the surface (in mm), column 3 specifies the distance d—also denoted as thickness—between the surface and the subsequent surface (in mm), and column 4 specifies the material of the optical components. Column 5 indicates the refractive index of the material, and column 6 specifies the optically free radius or the optically free semidiameter (or the lens height) of a lens surface or other surfaces (in mm) Radius r=0 corresponds to a planar surface.

The table or tables are designated by the same numbers as the respective figures. A table with additional designation "A" specifies the corresponding aspheric or other relevant data. The aspheric surfaces are calculated according to the following specification:

$$p(h)=[((1/r)h^2)/(1+SQRT(1-(1+K)(1/r)^2h^2))]+C1*h^4+C2*h^6+\ldots$$

In this case, the reciprocal (1/r) of the radius specifies the surface curvature and h specifies the distance between a surface point and the optical axis (i.e. the ray height). Consequently, p(h) specifies the so-called sagitta, that is to say the distance between the surface point and the surface vertex in the z direction (direction of the optical axis). Constant K is the conic constant, and parameters, C1, C2 are aspheric constants.

TABLE 7

| NA = 1.55; λ = 193 nm | | | | | |
|---|---|---|---|---|---|
| SURF | RADIUS | THICK-NESS | MATE-RIAL | INDEX | SEMI-DIAM. |
| 0 | 0.000000 | 30.199717 | | | 65.8 |
| 1 | 213.835309 | 36.914109 | QUARTZ | 1.560326 | 86.1 |
| 2 | −298.703853 | 89.541117 | | | 86.9 |
| 3 | 152.797911 | 71.780030 | QUARTZ | 1.560326 | 94.9 |
| 4 | −333.865186 | 30.066016 | | | 89.0 |
| 5 | −746.763321 | 10.352894 | QUARTZ | 1.560326 | 70.1 |
| 6 | −349.235862 | 1.538751 | | | 67.9 |
| 7 | 0.000000 | 10.000000 | QUARTZ | 1.560326 | 68.6 |
| 8 | 0.000000 | 7.244885 | | | 71.7 |
| 9 | 231.159744 | 62.564136 | QUARTZ | 1.560326 | 83.3 |
| 10 | −261.502800 | 3.099311 | | | 86.6 |
| 11 | −202.748706 | 28.746404 | QUARTZ | 1.560326 | 85.7 |
| 12 | −180.377379 | 320.062055 | | | 88.1 |
| 13 | −178.287197 | −233.744428 | REFL | | 146.3 |
| 14 | 194.124245 | 298.682241 | REFL | | 150.0 |
| 15 | 639.699522 | 23.144078 | QUARTZ | 1.560326 | 116.1 |
| 16 | 596.628327 | 26.508690 | | | 114.3 |
| 17 | 974.135855 | 19.999960 | QUARTZ | 1.560326 | 110.0 |
| 18 | 147.156329 | 65.897673 | | | 99.7 |
| 19 | −286.391094 | 14.999860 | QUARTZ | 1.560326 | 100.6 |
| 20 | −1016.261532 | 17.682973 | | | 108.9 |
| 21 | −1176.571197 | 29.137485 | QUARTZ | 1.560326 | 116.3 |
| 22 | −718.801212 | 16.249652 | | | 121.7 |
| 23 | 514.056424 | 27.968021 | QUARTZ | 1.560326 | 142.4 |
| 24 | 2740.141905 | 9.667059 | | | 143.9 |
| 25 | 267.103517 | 65.998935 | QUARTZ | 1.560326 | 156.6 |
| 26 | −950.888018 | 14.789219 | | | 156.7 |
| 27 | 204.648870 | 79.628892 | QUARTZ | 1.560326 | 160.0 |
| 28 | −906.647970 | 20.175562 | | | 157.0 |
| 29 | 0.000000 | −19.175601 | | | 147.2 |
| 30 | 185.470876 | 73.244488 | QUARTZ | 1.560326 | 136.8 |
| 31 | 633.167969 | 0.999435 | | | 128.2 |
| 32 | 123.514322 | 33.744817 | QUARTZ | 1.560326 | 93.5 |
| 33 | 472.658461 | 0.998652 | | | 86.7 |
| 34 | 75.071597 | 60.000372 | SPINEL | 1.920000 | 62.1 |
| 35 | 0.000000 | 3.000000 | IMMERS | 1.650000 | 24.8 |
| 36 | 0.000000 | 0.000000 | | | 16.5 |

TABLE 7A

Aspheric Constants

| | SRF | | | | |
|---|---|---|---|---|---|
| | 2 | 3 | 5 | 6 | 10 |
| K | 0 | 0 | 0 | 0 | 0 |
| C1 | 1.160803E−07 | −4.007666E−08 | −1.789625E−07 | 3.212290E−08 | −1.073224E−07 |
| C2 | −4.815011E−12 | 1.179488E−12 | −3.688529E−11 | −2.555675E−11 | −8.909027E−12 |
| C3 | 2.290747E−16 | 4.983024E−16 | 2.556602E−15 | 2.078774E−15 | 7.514127E−16 |
| C4 | 5.302224E−21 | −1.290287E−19 | 4.200891E−19 | 4.860088E−19 | −2.656933E−21 |
| C5 | −2.436388E−24 | 1.780590E−23 | 4.945908E−22 | 4.801156E−22 | 1.856319E−23 |
| C6 | 2.641164E−28 | −1.590259E−27 | −1.675649E−25 | −1.792130E−25 | −4.031812E−27 |
| C7 | −1.381076E−32 | 7.730373E−32 | 1.951793E−29 | 2.372209E−29 | 3.217510E−31 |
| C8 | 3.268688E−37 | −1.595413E−36 | −8.483108E−34 | −1.256096E−33 | −9.358964E−36 |

| | SRF | | | | |
|---|---|---|---|---|---|
| | 12 | 13 | 14 | 15 | 17 |
| K | 0 | −2.409560 | −2.817830 | 0 | 0 |
| C1 | 1.588736E−07 | −4.405615E−08 | 4.282361E−08 | 8.517873E−08 | 8.002047E−08 |
| C2 | 5.905439E−12 | 5.602187E−13 | −6.461901E−13 | −4.422850E−12 | 2.868675E−12 |
| C3 | −5.007493E−16 | −2.056364E−17 | 2.330896E−17 | 3.773152E−16 | −6.534126E−16 |
| C4 | −1.397433E−20 | 5.443083E−22 | −6.933209E−22 | −2.671835E−20 | 7.523742E−20 |
| C5 | −1.411215E−23 | −1.633825E−26 | 2.104822E−26 | 1.960114E−24 | −6.358082E−24 |
| C6 | 3.342339E−27 | 3.609825E−31 | −4.921737E−31 | −1.072080E−28 | 3.512554E−28 |
| C7 | −2.593109E−31 | −5.468890E−36 | 7.748212E−36 | 3.545392E−33 | −1.103942E−32 |
| C8 | 7.064676E−36 | 3.341875E−41 | −5.654483E−41 | −4.824750E−38 | 1.281454E−37 |

| | SRF | | | | |
|---|---|---|---|---|---|
| | 20 | 21 | 24 | 25 | 26 |
| K | 0 | 0 | 0 | 0 | 0 |
| C1 | 1.829220E−07 | 1.498444E−07 | 1.342049E−08 | −1.171924E−08 | 2.489304E−08 |
| C2 | −7.771321E−12 | −1.146763E−11 | −3.041498E−12 | −9.978248E−13 | 1.120833E−13 |
| C3 | −3.309744E−16 | 2.755329E−16 | 1.887086E−17 | 6.128276E−17 | −4.739005E−17 |
| C4 | 5.361435E−20 | 1.694549E−20 | −5.014160E−21 | −2.242668E−21 | 5.113040E−22 |
| C5 | −1.038449E−24 | −2.387786E−24 | −5.478076E−26 | 7.133872E−27 | 5.828844E−26 |
| C6 | −1.478692E−28 | 1.321198E−28 | 1.024161E−29 | 5.050170E−30 | 1.200750E−30 |
| C7 | 1.132959E−32 | −3.737735E−33 | −3.314731E−34 | −2.351904E−34 | −1.780081E−34 |
| C8 | −2.452087E−37 | 4.957632E−38 | 4.043237E−39 | 3.270199E−39 | 3.281961E−39 |

| | SRF | | | | |
|---|---|---|---|---|---|
| | 27 | 28 | 31 | 32 | 33 |
| K | 0 | 0 | 0 | 0 | 0 |
| C1 | −2.214023E−08 | 6.720107E−09 | −8.799677E−08 | −3.806747E−08 | 8.046767E−08 |
| C2 | 6.271760E−14 | 1.877928E−12 | 4.544716E−12 | 3.058677E−12 | 2.194851E−12 |
| C3 | 1.937623E−17 | −9.166896E−17 | −1.376373E−17 | −1.702806E−16 | 3.245978E−16 |
| C4 | −1.317645E−21 | 3.266376E−21 | −1.350149E−20 | −8.682572E−21 | −4.701654E−20 |
| C5 | 6.808576E−27 | −1.772048E−25 | 1.073017E−24 | 2.101427E−23 | 2.101427E−23 |
| C6 | 1.744828E−30 | 5.503314E−30 | −4.171870E−29 | −1.416448E−27 | −3.258578E−27 |
| C7 | −9.953239E−35 | −8.367748E−35 | 8.286413E−34 | 1.515431E−31 | 2.401849E−31 |
| C8 | 1.581827E−39 | 6.039061E−40 | −6.439053E−39 | −8.484792E−36 | −7.318585E−36 |

What is claimed is:

1. A projection objective comprising:
a plurality of optical elements arranged so that, during use of the projection objective, the plurality of optical elements images a pattern from an object field in an object surface of the projection objective to an image field in an image surface region of the projection objective at an image-side numerical aperture $NA \geq 0.8$ through a medium with refractive index $n_1$ in an image space adjacent to the image surface with electromagnetic radiation defining an operating wavelength $\lambda$,
wherein, during use of the projection objective, the electromagnetic radiation forms a radiation beam including a plurality of rays incident on a plurality of optical surfaces with a plurality of respective angles of incidence, AOI, defining for each optical surface a maximum angle of incidence, $AOI_{MAX}$, which is the maximum angle of incidence present on any one of the optical surfaces with the exception of an exit surface adjacent to the image surface, and
wherein the condition $NA/n_1 > k \sin(AOI_{MAX})$ holds for $k \geq 1$.

2. The projection objective of claim 1, wherein the condition $NA/n_1 > k \sin(AOI_{MAX})$ holds for $k \geq 1.05$.

3. The projection objective of claim 1, wherein the condition $NA/n_1 > k \sin(AOI_{MAX})$ holds for $k \geq 1.1$.

4. The projection objective of claim 1, wherein the condition $NA/n_1 > k \sin(AOI_{MAX})$ holds for $k \geq 1.15$.

5. The projection objective of claim 1, wherein the condition $NA/n_1 > k \sin(AOI_{MAX})$ holds for $k \geq 1.2$.

6. The projection objective of claim 1, wherein $NA > 1$.

7. The projection objective of claim 1, wherein the projection objective is a catadioptric projection objective.

8. The projection objective of claim 1, wherein $NA \geq 1$, an overall transmission of the projection objective is greater than or equal to 70%, and a polarized uniformity error of the projection objective is less than or equal to 0.5%.

9. The projection objective of claim 1, wherein $\lambda$ is in a range between 155 nm and 250 nm.

10. An apparatus, comprising:
an illumination system; and
a projection objective according to claim 1,
wherein the apparatus is a microlithographic projection exposure apparatus.

11. The apparatus of claim 10, wherein the projection objective is a catadioptric projection objective.

12. A projection objective comprising:
a plurality of optical elements arranged so that, during use of the projection objective, the plurality of optical elements images a pattern from an object field in an object surface of the projection objective to an image field in an image surface region of the projection objective at an image-side numerical aperture NA with electromagnetic radiation defining an operating wavelength $\lambda$,
wherein, during use of the projection objective, the electromagnetic radiation forms a radiation beam including a plurality of rays incident on a plurality of optical surfaces with a plurality of respective angles of incidence, AOI, defining, for each optical surface, a maximum angle of incidence, $AOI_{MAX}$, which is the maximum angle of incidence present on the respective optical surface with the exception of an exit surface adjacent to the image surface,
wherein NA>1 and wherein $AOI_{MAX}<60°$.

13. The projection objective of claim 12, wherein NA>1.2 and wherein $AOI_{MAX}<55°$.

14. The projection objective of claim 12, wherein the projection objective is a catadioptric projection objective.

15. The projection objective of claim 14, wherein $AOI_{MAX}<55°$.

16. The projection objective of claim 14, wherein $AOI_{MAX}<50°$.

17. The projection objective of claim 12, wherein an overall transmission of the projection objective is greater than or equal to 70%, and a polarized uniformity error of the projection objective is less than or equal to 0.5%.

18. The projection objective of claim 12, wherein $AOI_{MAX}<55°$.

19. The projection objective of claim 12, wherein $AOI_{MAX}<50°$.

20. The projection objective of claim 12, wherein $\lambda$ is in a range between 155 nm and 250 nm.

21. An apparatus, comprising:
an illumination system; and
a projection objective according to claim 12,
wherein the apparatus is a microlithographic projection exposure apparatus.

22. The apparatus of claim 21, wherein the projection objective is a catadioptric projection objective.

* * * * *

UNITED STATES PATENT AND TRADEMARK OFFICE
CERTIFICATE OF CORRECTION

PATENT NO. : 8,345,222 B2
APPLICATION NO. : 12/580369
DATED : January 1, 2013
INVENTOR(S) : Daniel Kraehmer It is certified that error appears in the above-identified patent and that said Letters Patent is hereby corrected as shown below:

Column 4,
Line 33, after "250 nm" insert --.--

Column 7,
Line 5, delete "catadiopric" and insert --catadioptric--

Column 10,
Line 44, after "machine" insert --.--

Column 14,
Line 4, after "193 nm" insert --.--

Column 17,
Line 45, after "65.8 mm" insert --.--

Column 18,
Line 53, delete "bandwidth" and insert --band width--

Column 23,
Line 51, delete "objective" and insert --objective,--

Column 23,
Line 59, delete "$n_1$" and insert --$n_I$--

Column 24,
Line 54, delete "$NA/n_1 > k$" and insert --$NA/n_I > k$--

Column 24,
Line 56, delete "$NA/n_1 > k$" and insert --$NA/n_I > k$--

Signed and Sealed this
Twelfth Day of March, 2013

Teresa Stanek Rea
*Acting Director of the United States Patent and Trademark Office*

Column 24,
Line 58, delete "$NA/n_1>k$" and insert --$NA/n_I>k$--

Column 24,
Line 60, delete "$NA/n_1>k$" and insert --$NA/n_I>k$--

Column 24,
Line 62, delete "$NA/n_1>k$" and insert --$NA/n_I>k$--